United States Patent
Roh et al.

(10) Patent No.: US 11,652,121 B2
(45) Date of Patent: May 16, 2023

(54) COLOR SEPARATION ELEMENT AND IMAGE SENSOR INCLUDING THE SAME

(71) Applicant: SAMSUNG ELECTRONICS CO., LTD., Suwon-si (KR)

(72) Inventors: Sookyoung Roh, Yongin-si (KR); Seokho Yun, Hwaseong-si (KR); Hongkyu Park, Hwaseong-si (KR); Minwoo Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 241 days.

(21) Appl. No.: 17/104,976

(22) Filed: Nov. 25, 2020

(65) Prior Publication Data

US 2021/0167110 A1 Jun. 3, 2021

(30) Foreign Application Priority Data

Nov. 28, 2019 (KR) .......... 10-2019-0156107
Sep. 23, 2020 (KR) .......... 10-2020-0122850

(51) Int. Cl.
*H01L 27/146* (2006.01)

(52) U.S. Cl.
CPC .. *H01L 27/14625* (2013.01); *H01L 27/14605* (2013.01)

(58) Field of Classification Search
CPC ......... H01L 27/14625; H01L 27/14605; H01L 27/14621
See application file for complete search history.

(56) References Cited

U.S. PATENT DOCUMENTS

| | | | |
|---|---|---|---|
| 7,741,664 B2 | 6/2010 | Choi et al. | |
| 8,289,422 B2 | 10/2012 | Hiramoto et al. | |
| 9,601,529 B2 | 3/2017 | Seo et al. | |
| 9,673,236 B2 | 6/2017 | Jin et al. | |
| 10,698,141 B2 | 6/2020 | Yun et al. | |
| 10,760,953 B2 | 9/2020 | Roh et al. | |
| 2009/0160965 A1* | 6/2009 | Sorek | G02B 5/203 348/222.1 |
| 2012/0206637 A1 | 8/2012 | Hiramoto et al. | |
| 2012/0212656 A1 | 8/2012 | Hiramoto et al. | |
| 2015/0288935 A1* | 10/2015 | Shinozaki | H04N 5/345 348/322 |

(Continued)

FOREIGN PATENT DOCUMENTS

| | | |
|---|---|---|
| KR | 10-1468369 B1 | 12/2014 |
| KR | 10-2018-0065698 A | 6/2018 |
| KR | 10-2018-0113783 A | 10/2018 |

OTHER PUBLICATIONS

Seiji Nishiwaki et al., "Efficient colour splitters for high-pixel-density image sensors", Nature Photonics, Mar. 2013, vol. 7, pp. 240-246 (7 pages total).

*Primary Examiner* — Bitew A Dinke
(74) *Attorney, Agent, or Firm* — Sughrue Mion, PLLC

(57) ABSTRACT

A color separation element and an image sensor including the same are disclosed. The color separation element includes a spacer layer, and a color separation lens array including at least one nano-post provided in the spacer layer to control a phase distribution of incident light so that light having the same wavelength of the incident light is multi-focused on a plurality of target regions; and periodic regions in which the phase distribution control layer is repeatedly arranged.

20 Claims, 43 Drawing Sheets

(56) References Cited

U.S. PATENT DOCUMENTS

| | | | | |
|---|---|---|---|---|
| 2015/0318318 A1* | 11/2015 | Nam | ................. | H01L 27/14623 |
| | | | | 257/432 |
| 2016/0118430 A1* | 4/2016 | Nam | ................. | H01L 27/14627 |
| | | | | 257/432 |
| 2017/0098672 A1* | 4/2017 | Yun | ................... | H01L 27/14621 |
| 2017/0221949 A1* | 8/2017 | Yokogawa | ......... | H04N 9/04559 |
| 2018/0164154 A1* | 6/2018 | Roh | ................. | H01L 27/14649 |
| 2018/0292585 A1* | 10/2018 | Yun | ................... | H01L 27/14645 |
| 2018/0323242 A1* | 11/2018 | Drzaic | ................ | H01L 51/5262 |
| 2019/0088904 A1* | 3/2019 | Cho | .................... | H01L 51/5206 |
| 2019/0346599 A1* | 11/2019 | Komai | ............. | H01L 27/14645 |
| 2020/0076999 A1* | 3/2020 | Akiyama | ............. | H04N 5/2254 |
| 2021/0124179 A1* | 4/2021 | Yun | ..................... | G02B 5/1876 |
| 2021/0125301 A1* | 4/2021 | Park | ......................... | G06T 7/44 |
| 2021/0126029 A1* | 4/2021 | Roh | ................. | H01L 27/14645 |
| 2021/0126030 A1* | 4/2021 | Yun | ................... | H01L 27/14621 |
| 2021/0126032 A1* | 4/2021 | Roh | ................. | H01L 27/14621 |
| 2021/0126035 A1* | 4/2021 | Roh | ................. | G02B 5/1876 |
| 2021/0249459 A1* | 8/2021 | Yun | .................... | H01L 27/14605 |
| 2021/0389184 A1* | 12/2021 | Kondo | ................. | G01J 3/0259 |
| 2022/0137423 A1* | 5/2022 | Yun | ................... | H01L 27/14621 |
| | | | | 348/272 |
| 2022/0141427 A1* | 5/2022 | Roh | ................... | G02B 27/1013 |
| | | | | 348/164 |
| 2022/0150453 A1* | 5/2022 | Lee | ........................ | G02B 1/005 |
| 2022/0208822 A1* | 6/2022 | Yun | ................... | H01L 27/14621 |

* cited by examiner

FIG. 3B

| C | C | M | M | C | C | M | M |
|---|---|---|---|---|---|---|---|
| C | C | M | M | C | C | M | M |
| Y | Y | G | G | Y | Y | G | G |
| Y | Y | G | G | Y | Y | G | G |
| C | C | M | M | C | C | M | M |
| C | C | M | M | C | C | M | M |
| Y | Y | G | G | Y | Y | G | G |
| Y | Y | G | G | Y | Y | G | G |

FIG. 3C

| R | R | G | G | R | R | G | G |
|---|---|---|---|---|---|---|---|
| R | R | G | G | R | R | G | G |
| B | B | W | W | B | B | W | W |
| B | B | W | W | B | B | W | W |
| R | R | G | G | R | R | G | G |
| R | R | G | G | R | R | G | G |
| B | B | W | W | B | B | W | W |
| B | B | W | W | B | B | W | W |

R

COLOR SEPARATION ELEMENT AND IMAGE SENSOR INCLUDING THE SAME

CROSS-REFERENCE TO RELATED APPLICATIONS

This application is based on and claims priority under 35 U.S.C. § 119 to Korean Patent Application Nos. 10-2019-0156107, filed on Nov. 28, 2019 and 10-2020-0122850, filed on Sep. 23, 2020, in the Korean Intellectual Property Office, the disclosures of which are incorporated by reference herein in their entirety.

BACKGROUND

1. Field

The disclosure relates to color separation elements and image sensor including the same.

2. Description of Related Art

A color display device or a color image sensor generally displays an image of various colors or detects a color of incident light by using a color filter. For example, a charge-coupled device (CCD) and a CMOS may be used as an image sensor.

Recently, the number of pixels of an image sensor is gradually increasing, and accordingly, pixel miniaturization is required. In order to miniaturize pixels, it is necessary to secure a light amount and remove noise.

However, since the color filter absorbs all colors of incident light of except for the color of light corresponding to the respective color filter, the light utilization efficiency may be reduced. For example, in the case of using an RGB color filter, only ⅓ of incident light is transmitted and the remaining ⅔ are absorbed, and thus, the light utilization efficiency is only about 33%, that is, the light loss is large.

Recently, in order to improve light utilization efficiency of an image sensor, an attempt has been made to use a color separation element instead of a color filter. A color separation element may separate a color of incident light by using a diffraction or refraction characteristic of different light according to a wavelength and may control the directionality of each wavelength according to a refractive index and shape. Colors separated by the color separation element may be transmitted to each of corresponding pixels.

SUMMARY

Provided are color separation elements capable of multiple focusing with respect to light of the same wavelength.

Provided are image sensors including a color separation element capable of multiple focusing with respect to light of the same wavelength.

Additional aspects will be set forth in part in the description which follows and, in part, will be apparent from the description, or may be learned by practice of the presented example embodiments of the disclosure.

According to an aspect of an example embodiment, there is provided a color separation element, which includes a spacer layer; and a color separation lens array comprising at least one nano-post provided in the spacer layer, the color separation lens array configured to control a phase distribution of incident light so that light having a same wavelength of the incident light is multi-focused on a plurality of target regions; and a plurality of periodic regions in which the color separation lens array is repeatedly arranged, wherein each of the periodic regions comprises a plurality of pixels arranged two-dimensionally, and pixels of a same wavelength light, among the plurality of pixels, are arranged adjacent to each other in at least one of a horizontal direction and a vertical direction of the two-dimensional arrangement.

Each of the plurality of periodic regions may include a first group pixel region including a plurality of first pixels for focusing first wavelength light, respectively, a second group pixel region including a plurality of second pixels for focusing second wavelength light, respectively, a third group pixel region including a plurality of third pixels for focusing third wavelength light, respectively, and a fourth group pixel region including a plurality of fourth pixels for focusing first wavelength light, respectively, wherein the first group pixel region and the fourth group pixel region are located in a diagonal direction, and the second group pixel region and the third group pixel region are located in a diagonal direction.

The first wavelength light may include green light, the second wavelength light may include blue light, and the third wavelength light may include red light.

The pixels in the first group pixel region may be adjacently disposed, the pixels in the second group pixel region may be adjacently disposed, the pixels in the third group pixel region may be adjacently disposed, and the pixels in the fourth group pixel region may be adjacently disposed.

The color separation element may be configured so that the first wavelength light has a phase of $2N\pi$ (N is an integer greater than 0) at the center of each pixel in the first group pixel region, and the phase is gradually decreased toward a periphery of the periodic region.

The color separation element may be configured so that the second wavelength light has a phase of $2M\pi$ (M is an integer greater than 0) at the center of each pixel in the second group pixel region and the phase is gradually decreased toward a periphery of the periodic region.

The color separation element may be configured so that the third wavelength light has a phase of $2L\pi$ (L is an integer greater than 0) at the center of each pixel in the third group pixel region and the phase is gradually decreased toward a periphery of the periodic region.

The periodic region may include a first 2×2 group pixel region where first wavelength light is focused, a second 2×2 group pixel region where second wavelength light is focused, a third 2×2 group pixel region where third wavelength light is focused, and a fourth 2×2 group pixel region where the first wavelength light is focused, respectively, wherein the first group pixel region and the fourth group pixel region are located in a diagonal direction, and the second group pixel region and the third group pixel region are located in a diagonal direction.

The periodic region may include a first 3×3 group pixel region where first wavelength light is focused, a second 3×3 group pixel region where second wavelength light is focused, a third 3×3 pixel region where the third wavelength light is focused, and a fourth 3×3 group pixel region where the first wavelength light is focused, respectively, wherein the first group pixel region and the fourth group pixel region are located in a diagonal direction, and the second group pixel region and the third group pixel region are located in a diagonal direction.

The periodic region may include a first 3×3 group pixel region where first wavelength light is focused, a second 3×3 group pixel region where second wavelength light is focused, a third 3×3 pixel region where the third wavelength light is focused, and a fourth 3×3 group pixel region where the first wavelength light is focused, respectively, wherein the first group pixel region and the fourth group pixel region are located in a diagonal direction, and the second group pixel region and the third group pixel region are located in a diagonal direction.

The color separation lens array may be configured to diverge incident light by wavelength and to control the phase distribution so that light of the same wavelength is multi-focused.

According to another aspect of an example embodiment, there is provided an image sensor including an optical sensor including a plurality of photosensitive cells for sensing light; a spacer layer provided in the optical sensor; a color separation lens array comprising at least one nano-post provided in the spacer layer to control a phase distribution of incident light so that light having the same wavelength of the incident light is multi-focused on a plurality of target regions, and a plurality of periodic regions in which the color separation lens array is repeatedly arranged, wherein each of the periodic regions comprises a plurality of pixels arranged two-dimensionally, and pixels of a same wavelength light, among the plurality of pixels, are arranged adjacent to each other in at least one of a horizontal direction and a vertical direction of the two-dimensional arrangement.

BRIEF DESCRIPTION OF THE DRAWINGS

The above and other aspects, features, and advantages of certain example embodiments of the disclosure will be more apparent from the following description taken in conjunction with the accompanying drawings, in which:

FIGS. 3A to 3C are diagrams illustrating an example of a pixel arrangement of an image sensor according to an example embodiment;

DETAILED DESCRIPTION

Figure 1:
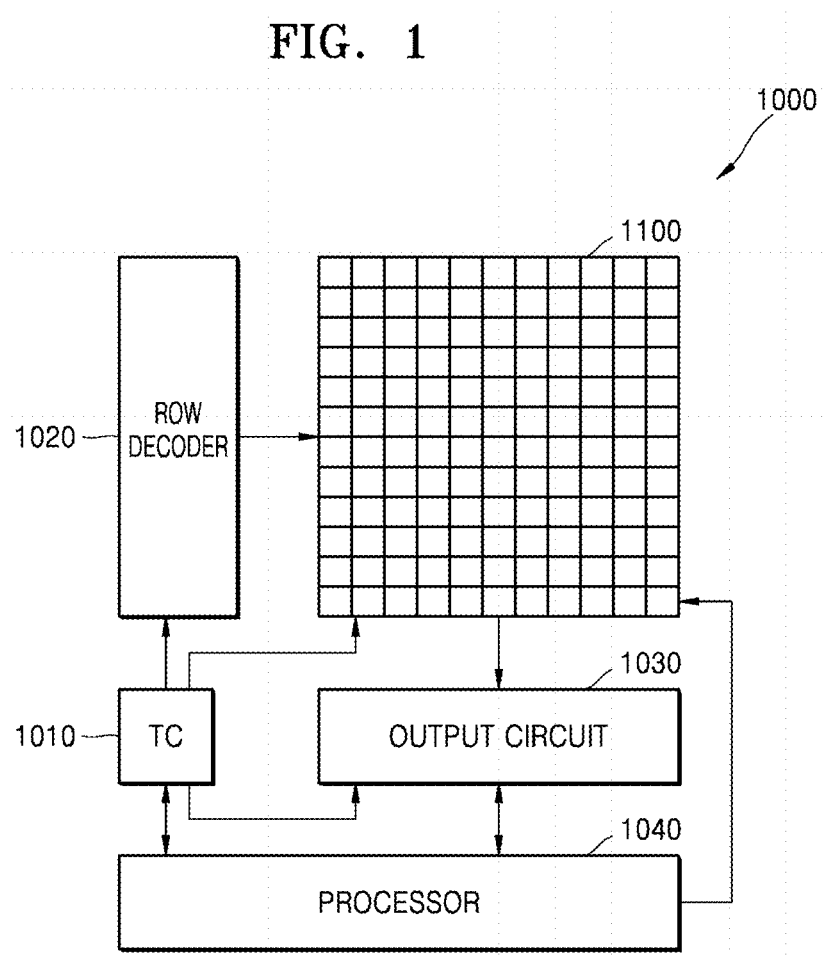
FIG. 1 is a schematic block diagram of an image sensor according to an example embodiment.

Reference will now be made in detail to example embodiments, examples of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, color separation elements and image sensors including the same according to various example embodiments will be described in detail with reference to the accompanying drawings. In the drawings, like reference numerals refer to like elements, and the size of each element in the drawings may be exaggerated for clarity and convenience of explanation. It will be understood that, although the terms "first", "second", etc. may be used herein to describe various elements, these elements should not be limited by these terms. These terms are only used to distinguish one element from another.

The singular forms include the plural forms unless the context clearly indicates otherwise. When a part "comprises" or "includes" an element in the specification, unless otherwise defined, it is not excluding other elements but may further include other elements. In the drawings, the size of each element in the drawings may be exaggerated for clarity and convenience of explanation. Also, when it is described that a predetermined material layer is present on a substrate or other layer, the material layer may be in direct contact with the substrate or another layer, or another third layer may be present therebetween. In addition, in the examples below, a material for forming each layer is an example, and another material may be used beside the material.

Also, in the specification, the term "units" or "... modules" denote units or modules that process at least one function or operation, and may be realized by hardware, software, or a combination of hardware and software.

Specific executions described in the disclosure are example embodiments and do not limit the technical scope of the disclosure. For conciseness of the specification, disclosure of electronic configurations of the related art, control systems, software, and other functional aspects of the systems may be omitted. In addition, connections or connection members of lines between components shown in the drawings illustrate functional connections and/or physical or circuit connections, and the connections or connection members can be represented by replaceable or additional various functional connections, physical connections, or circuit connections in an actual apparatus.

The term "above" and similar directional terms may be applied to both singular and plural.

With respect to operations that constitute a method, the operations may be performed in any appropriate sequence unless the sequence of operations is clearly described or unless the context clearly indicates otherwise. All examples or example terms (for example, etc.) are simply used to explain in detail the technical scope of the inventive concept, and thus, the scope of the inventive concept is not limited by the examples or the example terms as long as it is not defined by the claims.

FIG. 1 is a schematic block diagram of an image sensor 1000 according to an example embodiment.

Referring to FIG. 1, the image sensor 1000 according to an example embodiment may include a pixel array 1100, a timing controller TC 1010, a row decoder 1020, and an output circuit 1030. The image sensor 1000 may further include a processor 1040 configured to control the pixel array 1100, the timing controller 1010, and the output circuit 1030, and process an image signal output through the output circuit 1030. The image sensor 1000 according to an example embodiment may be a charge coupled device (CCD) image sensor or a complementary metal oxide semiconductor (CMOS) image sensor.

The pixel array 1100 includes a plurality of pixels arranged in two dimensions along a plurality of rows and a plurality of columns. The row decoder 1020 selects any one row from among a plurality of rows of the pixel array 1100 in response to a row address signal output from the timing controller 1010. The output circuit 1030 outputs a light detection signal in column units from a plurality of pixels arranged along the selected row. To this end, the output circuit 1030 may include a column decoder and an analog to digital converter (ADC). For example, the output circuit 1030 may include a plurality of ADCs arranged for each column between the column decoder and the pixel array 1100. Alternatively, the output circuit 1030 may include one ADC disposed at an output terminal of the column decoder. According to the example embodiment, the timing controller 1010, the row decoder 1020, and the output circuit 1030 may be implemented as a single chip, or may be implemented as separate chips. A processor for processing an image signal output through the output circuit 1030 may be implemented as a single chip together with the timing controller 1010, the row decoder 1020, and the output circuit 1030.

The pixel array 1100 may include a plurality of pixels that sense light of different wavelengths. An arrangement of a plurality of pixels that sense light of different wavelengths may be implemented in various ways.

Figure 2:
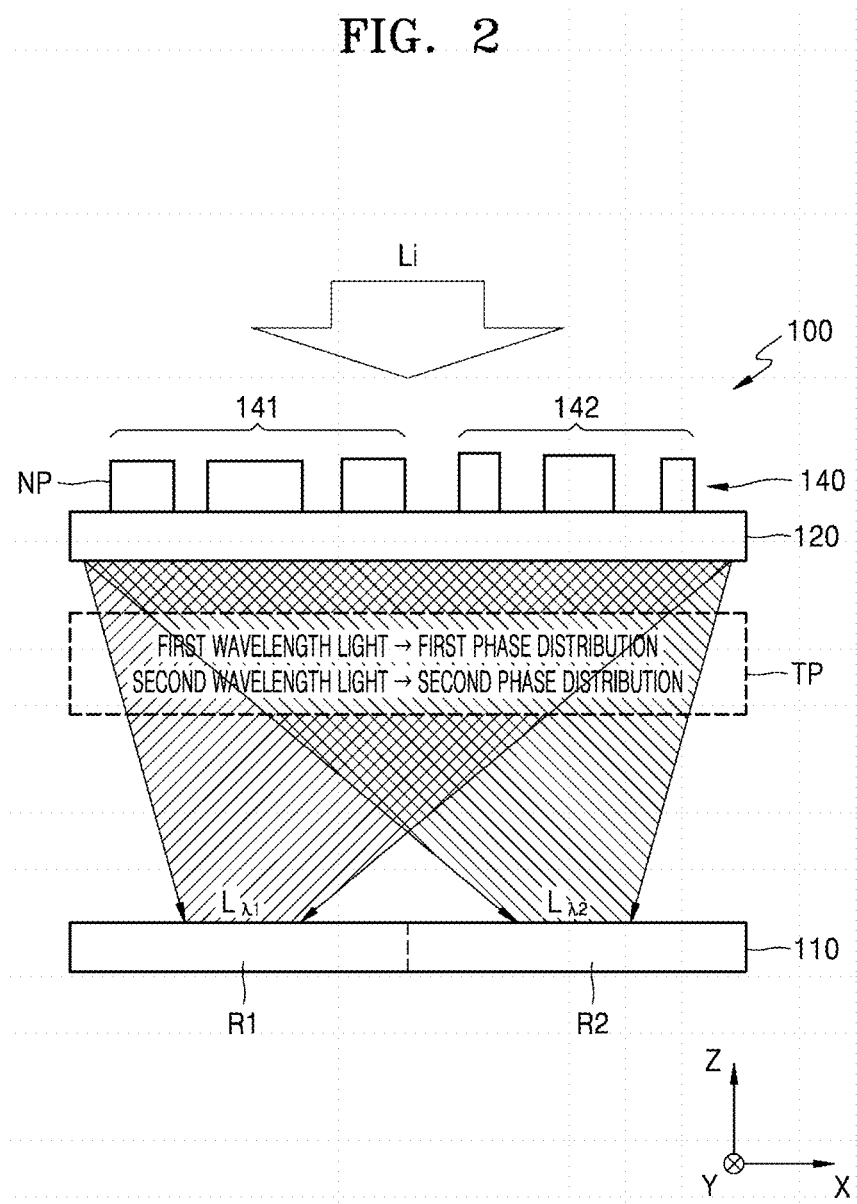
FIG. 2 is a schematic diagram of a color separation element according to an example embodiment.

FIG. 2 is a conceptual diagram illustrating a schematic structure of a color separation element 100 according to an example embodiment.

The color separation element 100 includes a spacer layer 120 and a color separation lens array 140 including a plurality of nano-posts NP on the spacer layer 120. The plurality of nano-posts NP may be arranged according to a rule. According to example embodiment, the rule may be a predetermined rule.

Here, the rule is applied to parameters, such as the shape, size, interval, and arrangement of the nano-post NP, and the parameters may be determined according to a target phase distribution TP to be implemented with respect to incident light Li. The size may be a width of the NP, a height of the NP, or both.

The color separation lens array 140 may control a phase distribution of light so that light of the same wavelength among the incident light Li is multiple-focused onto a plurality of target regions.

Also, the color separation lens array 140 may control a phase distribution of light so that the incident light Li is diverged and focused according to the wavelengths.

For convenience of illustration, a target phase distribution TP is displayed between the color separation element 100 and target regions R1 and R2 on an optical sensor 110, but the target phase distribution TP may denote a phase distribution at a location immediately after the incident light Li passes through the color separation element 100. The color separation lens array 140 may diverge the incident light Li by wavelength and control the phase distribution of light of each wavelength so that the diverged light of each wavelength is focused on the predetermined target regions R1 and R2, respectively.

The plurality of nano-posts NP may include a material having a greater refractive index than that of a peripheral material, and the spacer layer 120 may include a material having a lower refractive index than that of the plurality of nano-posts N P.

The plurality of nano-posts NP may include at least one of, for example, c-Si, p-Si, a-Si, a Group III-V compound semiconductor (GaP, GaN, GaAs, etc.), SiC, $TiO_2$, and SiN. The spacer layer 120 may include any one of materials of glass (fused silica, BK7, etc.), quartz, polymer (PMMA, SU-8, etc.), and plastic.

The plurality of nano-posts NP having a refractive index difference from a peripheral material may change the phase of light passing through the plurality of nano-posts NP. The phase change is due to a phase delay caused by a shape dimension of a sub-wavelength of the plurality of nano-posts NP, and the degree of phase delay is determined by a detailed shape dimension and arrangement form, etc. of the plurality of nano-posts NP. The plurality of nano-posts NP may achieve various optical functions by appropriately setting the degree of phase delay occurring in each of the plurality of nano-posts NP.

The color separation element 100 may determine detailed rules of the plurality of nano-posts NP according to a target phase distribution TP for implementing multiple focusing on a location with respect to the same wavelength.

The phase of first wavelength light $L_{\lambda 1}$ at a location immediately after the light $L_{\lambda 1}$ passes through the color separation element 100 may be $2N\pi$ (N is an integer greater than 0) at the center of a location corresponding to a first region 141, and may be $(2N-1)\pi$ (N is an integer) at the center of a location corresponding to a second region 142.

The method of multi-focusing with respect to the light $L_{\lambda 1}$ of the first wavelength described above may be equally applied to light of a second wavelength and light of a third wavelength. For example, the first wavelength, the second wavelength, and the third wavelength may be visible light wavelength bands, but are not limited thereto and may implement various wavelength bands according to the arrangement rule of the plurality of nano-posts NP.

The color separation lens array 140 may include the first region 141 and the second region 142, each including at least one nano-post NP. The first region 141 and the second region 142 respectively may be disposed to face the first target region R1 and the second target region R2, and may correspond one-to-one. Although it is depicted that the first region 141 and the second region 142 respectively include three nano-posts NP, it is an example. Also, although it is depicted that the nano-post NP is to be entirely located within any one of the first region 141 and the second region 142, the nano-post NP is not limited thereto, that is, the nano-post NP may be disposed at a boundary between the first region 141 and the second region 142. For example, the color separation lens array 140 may be configured so that the first wavelength light $L\lambda_1$ among the incident light Li is focused on the first target region R1 with a first phase distribution and the first wavelength light $L\lambda_1$ is focused on the second target region R2 with a second phase distribution. Also, the color separation lens array 140 may be configured so that second wavelength light $L\lambda_2$ among the incident light Li is focused on another target region with a third phase distribution and the second wavelength light $L\lambda_2$ is focused on an another target region with a fourth phase distribution.

Figure 3A:
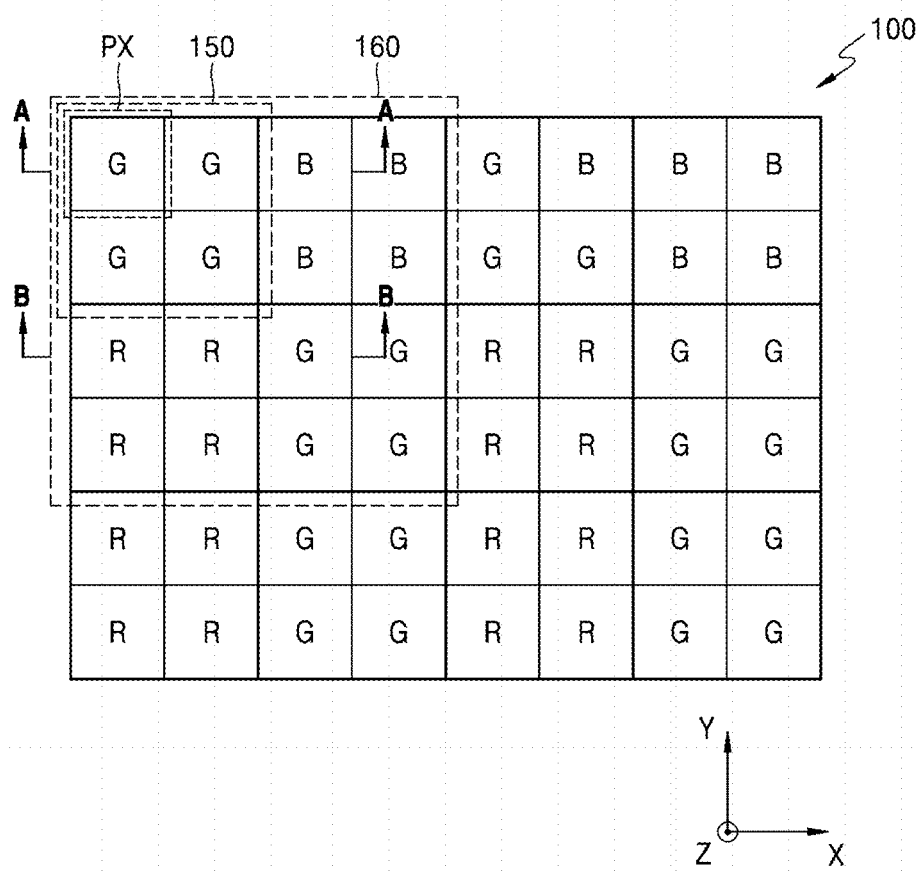

For example, FIGS. 3A to 3C show various pixel arrangements of the pixel array 1100 of the image sensor 1000 according to an example embodiment.

FIG. 3A shows an example of a pixel arrangement structure. A pixel PX may represent a minimum unit capable of sensing light for each wavelength and electrically processing a light amount. Referring to FIG. 3A, the color separation element 100 may include periodic regions 160 in which the arrangement of nano-posts NP of the color separation lens array 140 illustrated in FIG. 2 is repeated. The periodic regions 160 may be repetitive regions of units that separate the incident light Li by wavelength. The periodic regions 160 may include group pixel regions 150 in which a plurality of pixels PX for light of the same wavelength are arranged adjacent to each other. The group pixel regions 150 may have a multi-pixel arrangement. The multi-pixel arrangement shows a structure in which pixels for same wavelength light are successively arranged in a horizontal direction (X direction) or a vertical direction (Y direction) when the pixels are two-dimensionally arranged. In other words, the periodic regions 160 include pixels PX two-dimensionally arranged, and pixels PX for the same wavelength light are successively arranged in at least one of a horizontal direction (X direction) and a vertical direction (Y direction) of the two-dimensional arrangement. The periodic region 160 may include a plurality of group pixel regions 150. The periodic region 160 may correspond to a repeated arrangement of the plurality of group pixel regions 150.

For example, in FIG. 3A, the periodic region 160 may correspond to a 4×4 pixel region. In other words, each of the periodic regions 160 may include 16 pixels PX. Each of the periodic regions 160 may be divided into, for example, 16 parts, and may be configured to separate the incident light Li into green light G, blue light B, and red light R. Each of the periodic regions 160 may include, for example, a 2×2 green pixel group G, a 2×2 blue pixel group B, a 2×2 red pixel group R, and a 2×2 green pixel group G. The pixel array may be repeatedly and two-dimensionally arranged in a first direction (X direction) and a second direction (Y direction). Here, the same reference numerals are used for the pixel and each wavelength light.

According to another example embodiment, besides the arrangement illustrated in FIG. 3A, arrangement methods of the pixel array 1100 of the image sensor 1000 may be variously implemented. For example, referring to FIG. 3B, a CYGM method in which a magenta pixel group M, a cyan pixel group C, a yellow pixel group Y, and a green pixel group G constitute one unit pixel is also possible. Also, referring to FIG. 3C, an RGBW method in which a green pixel group G, a red pixel group R, a blue pixel group B, and a white pixel group W constitute one periodic region is also possible. Also, according to an example embodiment, each pixel group may have a 3×2 array shape. Besides above, pixels of the pixel array 1100 may be arranged in various ways according to the color characteristics of the image sensor 1000.

The color separation element described above may be applied to various image sensors. Hereinafter, an example embodiment in which a color separation element is applied to an image sensor will be described.

Figure 4:
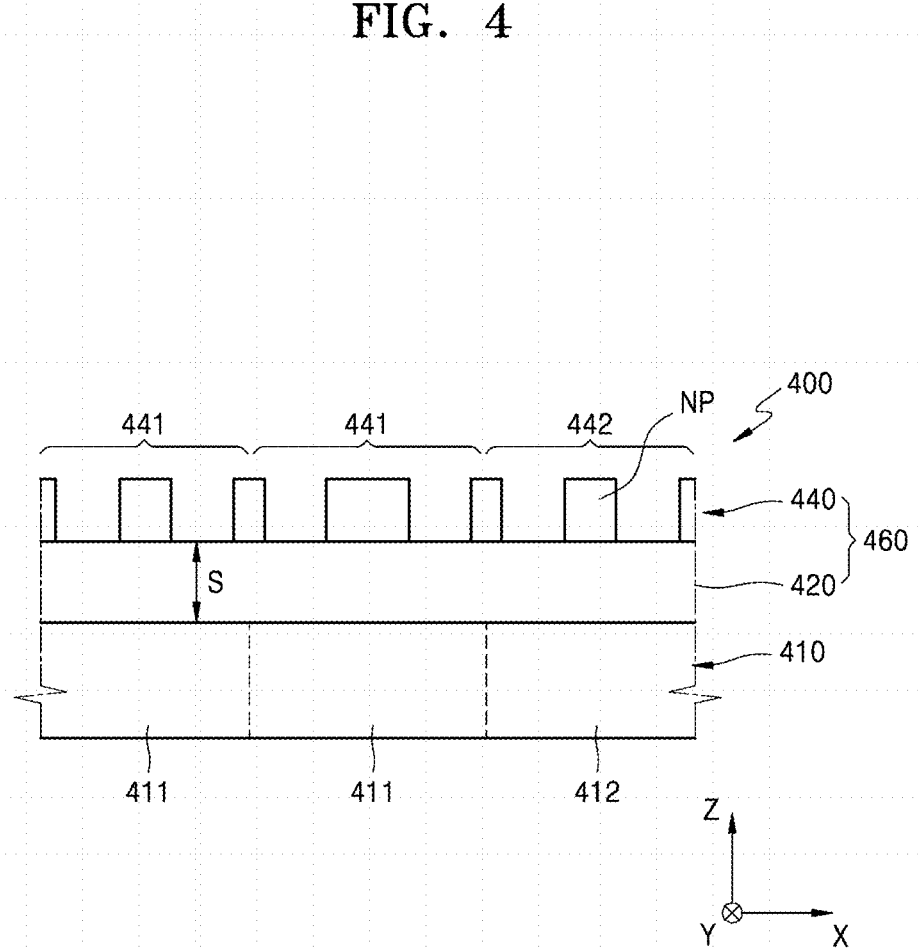
FIGS. 4 and 5 are schematic cross-sectional views illustrating an optical element according to an example embodiment.
Figure 5:
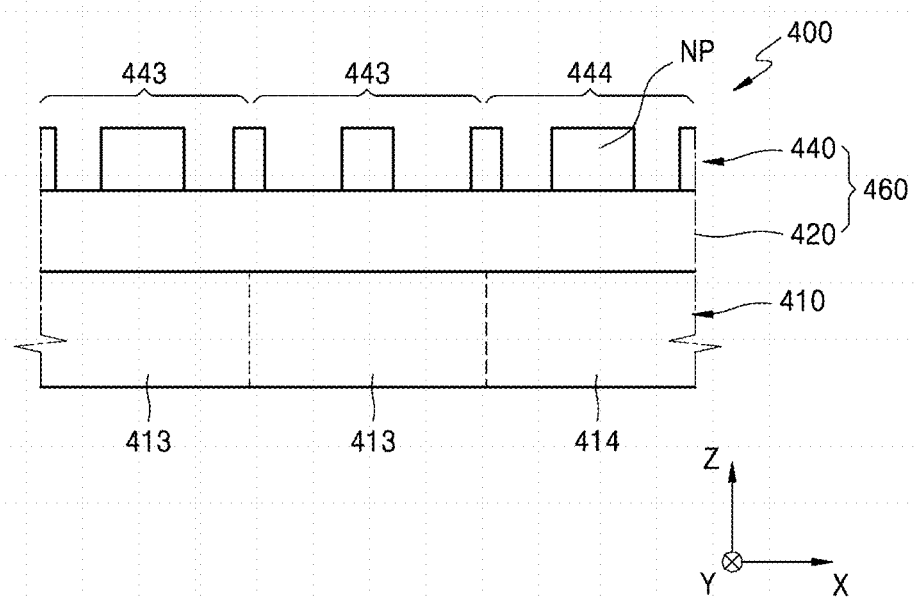

FIGS. 4 and 5 are schematic cross-sectional views each showing a structure of an image sensor 400 viewed in different cross-sections, according to an example embodiment. When describing in connection with the pixel arrangement structure of FIG. 3A, FIG. 4 may be a cross-sectional view taken along line A-A, and FIG. 5 may be a cross-sectional view taken along line B-B of FIG. 3.

The image sensor 400 may include an optical sensor 410 including a plurality of photosensitive cells 411, 412, 413, and 414 for sensing light, and a color separation element 460 on the optical sensor 410.

The optical sensor 410 may include a first photosensitive cell 411, a second photosensitive cell 412, a third photosensitive cell 413, and a fourth photosensitive cell 414 for converting light into an electrical signal. The first photosensitive cells 411 in a 2×2 array and the second photosensitive cells 412 in a 2×2 array are alternately arranged, and the third photosensitive cells 413 in a 2×2 array and the fourth photosensitive cells 414 in a 2×2 array may be alternately arranged.

The division of the region is for sensing incident light in pixel units, for example, the first photosensitive cell 411 may sense first wavelength light, and the second photosensitive cell 412 may sense second wavelength light, the third photosensitive cell 413 may sense third wavelength light, and the fourth photosensitive cell 414 may sense first wavelength light. For example, the first wavelength light may be green light G, the second wavelength light may be blue light B, and the third wavelength light may be red light R. However, the example embodiment is not limited thereto. As such, according to another example embodiment, a separator may further be provided at a boundary between pixels.

The color separation element 460 includes a color separation lens array 440 in which a plurality of nano-posts NP are arranged in a predetermined rule. The color separation lens array 440 may be supported by a spacer layer 420. The spacer layer 420 may be provided to maintain a distance S between the optical sensor 410 and the plurality of nano-posts NP. According to an example embodiment, the distance S may be predetermined. Also, a protective layer may further be provided to protect the plurality of nano-posts NP. The dielectric layer may have the same height as or greater than the nano-post NP, and may be provided around the plurality of nano-posts NP. The dielectric layer may include a dielectric material having a refractive index less than that of a material forming the plurality of nano-posts NP.

The shape, size, and arrangement of the plurality of nano-posts NP may be determined to form a phase distribution that focuses light of different wavelengths from each other in the first photosensitive cell 411, the second photosensitive cell 412, the third photosensitive cell 413, and the fourth photosensitive cell 414. The color separation lens array 440 may be divided into a plurality of regions 441, 442, 443, and 444 facing one-to-one with the first to fourth photosensitive cells 411, 412, 413, and 414. At least one nano-post NP may be disposed in each of the plurality of regions 441, 442, 443, and 444, and at least one of a shape, size, and arrangement of the nano-posts NP may be different from each other depending on the region.

As depicted in FIGS. 4 and 5, it may be configured so that the first region 441 and the first photosensitive cell 411 correspond to each other, the second region 442 and the second photosensitive cell 412 correspond to each other, the third region 443 and the third photosensitive cell 413 correspond to each other, and the fourth region 444 and the fourth photosensitive cell 414 correspond to each other.

The color separation lens array 440 may effectively focus by using a color separation element even when pixels of the same color are continuously arranged by multiple focusing light of a first wavelength to the first photosensitive cell 411, multiple focusing light of a second wavelength to the second photosensitive cell 412, multiple focusing light of a third wavelength to the third photosensitive cell 413, and multiple focusing the light of the first wavelength to the fourth photosensitive cell 414.

Figure 6:
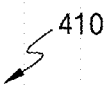
FIG. 6 is a schematic plan view of an optical sensor included in an image sensor according to an example embodiment.
Figure 6:
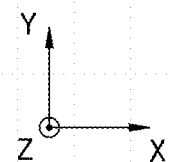

FIG. 6 shows a plan view of the optical sensor 410. Referring to FIG. 6, in first and second rows, the first photosensitive cells 411 in a 2×2 array and the second photosensitive cells 412 in a 2×2 array are alternately arranged, and, in third and fourth rows, the third photosensitive cells 413 in a 2×2 array and the fourth photosensitive cells 414 in a 2×2 array are alternately arranged, and such an arrangement structure may be alternately repeated. In the optical sensor 410, the plurality of first photosensitive cells 411, the second photosensitive cells 412, the third photosensitive cells 413, and the fourth photosensitive cells 414 are two-dimensionally arranged in the first direction (X direction) and the second direction (Y direction). For example, referring to FIGS. 3A and 6, the first photosensitive cell 411 and the fourth photosensitive cell 414 may correspond to the green pixel G, and the second photosensitive cell 412 may correspond to the blue pixel B, and the fourth photosensitive cell 313 may correspond to the red pixel R.

The illustrated arrangement rule of the color separation lens array 440 is an example for implementing a target phase distribution for multiple focusing light of a first wavelength to the first photosensitive cell 411 and the fourth photosensitive cell 414 by diverging the light of a first wavelength, light of a second wavelength to the second photosensitive cell 412 by diverging the light of the second wavelength, light of a third wavelength to the third photosensitive cell 413 by diverging the light of the third wavelength, but is not limited to the illustrated pattern.

The shape and size of the nano-posts NP provided in the first region 441, the second region 442, the third region 443, and the fourth region 444 respectively of the color separation lens array 440 may be determined so that a phase that induces the light of the first wavelength is multi-focused in the first photosensitive cell 411 and the fourth photosensitive cell 414 and prevents the light of the first wavelength from being focused in the second photosensitive cell 412 and the third photosensitive cell 413 adjacent to the first photosensitive cell 411 and the fourth photosensitive cell 414 is formed at a location immediately after passing through the color separation lens array 440.

Likewise, the shape, size, and arrangement of the nano-posts NP provided in the first region 441, the second region 442, the third region 443, and the fourth region 444, respectively may be determined so that a phase that induces light of the second wavelength is multi-focused in the second photosensitive cell 412 and prevents the light of the second wavelength from being focused in the first photosensitive cell 411, the third photosensitive cell 413, and the fourth photosensitive cell 414 adjacent to the second photosensitive cell 412 is formed at a location immediately after passing through the color separation lens array 440.

Also, the shape, size, and arrangement of the nano-posts NP provided in the first region 441, the second region 442, the third region 443, and the fourth region 444, respectively may be determined so that a phase that induces light of the third wavelength is multi-focused in the third photosensitive cell 413 and prevents the light of the third wavelength from being focused in the first photosensitive cell 411, the second photosensitive cell 412, and the fourth photosensitive cell 414 adjacent to the second photosensitive cell 413 is formed at a location immediately after passing through the color separation lens array 440.

The shape, size, and arrangement of the nano-posts NP satisfying all of these conditions may be determined, and the color separation lens array 440 may allow light immediately after passing through the color separation lens array 440 to have the following a target phase distribution. At a location immediately after passing through the color separation lens array 440, that is, on a lower surface of the color separation lens array 440 or an upper surface of the spacer layer 420, a phase of light of the first wavelength may have a distribution representing a phase difference of $2N\pi$ at the center of the first region 431 corresponding to the first photosensitive cell 411 and at the center of the fourth region 434 corresponding to the fourth photosensitive cell 414, and a phase difference of $(2N-1)\pi$ at the center of the second region 432 corresponding to the second photosensitive cell 412 and at the center of the third region 432 corresponding to the third photosensitive cell 413. Here, N is an integer greater than 0.

In other words, the phase of the light of the first wavelength at the location immediately after passing through the color separation lens array 440 is maximized at the center of the first region 441 and the center of the fourth region 444, and is gradually decreased in a shape of a concentric circle away from the center of the first region 441 and the center of the fourth region 444, and is minimized at the center of the second region 442 and the center of the third region 443. In the present example embodiment, a plurality of first regions 441 are provided adjacent to each other, and each of the first regions 441 may exhibit a phase difference of $2N\pi$ at the center thereof. A plurality of fourth regions 444 are provided adjacent to each other, and each of the fourth regions 444 may exhibit a phase difference of $2N\pi$ at the center thereof. For example, in the case of N=1, the phase of the light of the first wavelength at the location passing through the color separation lens array 440 is $\pi$ at the center of the first region 441 and the center of the fourth region 444, and is $\pi$ at the center of the second region 442 and the center of the third region 443. Here, the phase may denote a relative phase value after passing through with respect to a phase immediately before the light passes through the nano-posts NP.

Also, the phase of the light of the second wavelength at the location immediately after passing through the color separation lens array 440 may be 2Mπ at the center of the second region 442 corresponding to the second photosensitive cell 412 and may be (2M−1)π at the center of the first region 441 corresponding to the first photosensitive cell 411, the center of the fourth region 444 corresponding to the fourth photosensitive cell 414, and the center of the third region 443 corresponding to the third photosensitive cell 413. Here, M is an integer greater than 0. In other words, the phase of the light of the second wavelength at the location immediately after passing through the color separation lens array 440 is maximum at the center of the second region 442, and is gradually decreased in a shape of a concentric circle away from the center of the second region 442 and is locally minimum at the centers of the first region 441, the fourth region 444, and the third region 443. For example, in the case of M=1, the phase of the light of the second wavelength at the location passing through the color separation lens array 440 may be 2π at the center of the second region 442, may be 1T at the center of the fourth region 444, and may be in a range from about 0.2π to about 0.7π at the center of the third region 443.

Also, the phase of light of the third wavelength at the location immediately after passing through the color separation lens array 440 may be 2Lπ at the center of the third region 443 corresponding to the third photosensitive cell 413, may be (2L−1)π at the centers of the first region 441 corresponding to the first photosensitive cell 411 and the fourth region 444 corresponding to the fourth photosensitive cell 414, and may be greater than (2L−2)π and less than (2L−1)π at the center of the second region 442 corresponding to the second photosensitive cell 412. Here, L is an integer greater than 0. In other words, the phase of the light of the third wavelength at the location immediately after passing through the color separation lens array 440 is maximum at the center of the third region 443, and is gradually decreased in a shape of a concentric circle away from the center of the third region 443 and is locally minimum at the centers of the first region 441, the fourth region 444, and the second region 442. For example, in the case of L=1, the phase of the light of the third wavelength at the location passing through the color separation lens array 440 may be 2π at the center of the third region 443, may be π at the centers of the first and fourth regions 441 and 444, and may be in a range from about 0.2π to about 0.7π at the center of the second region 442.

Here, the target phase distribution described above denotes a phase distribution of light at a location immediately after passing through the color separation lens array 440. When light having the phase distribution reaches the first photosensitive cell 411, the second photosensitive cell 412, the third photosensitive cell 413, and the fourth photosensitive cell 414 from the color separation lens array 440, light with a wavelength corresponding to each photosensitive cell may be multi-focused at each location. Light transmitted through the color separation lens array 440 is diverged according to a wavelength, proceeds in different directions from each other, and is focused, and light having the same wavelength may be multi-focused on adjacent regions.

When light of the phase distribution proceeds toward the plurality of photosensitive cells 411, 412, 413, and 414, in order to be proceed light of the first wavelength towards the first photosensitive cell 411 and the fourth photosensitive cell 414, light of the second wavelength towards the second photosensitive cell 412, and light of the third wavelength towards the third photosensitive cell 413 and to be respectively focused on the corresponding cells, a predetermined propagation distance requirement may be determined. Accordingly, the thickness h of the spacer layer 420 may be determined. The thickness h of the spacer layer 420 may depend on a wavelength A that is a diverging target or a pixel size. The thickness h of the spacer layer 420 may be greater than a wavelength to be diverged. For example, the thickness may be greater than a center wavelength λ of a visible light wavelength band. The thickness h of the spacer layer 420 may be 1λ or more. The thickness h of the spacer layer 420 may depend on an arrangement period p of photosensitive cells. The arrangement period p may be expressed as a distance between the centers of adjacent photosensitive cells. The thickness h of the spacer layer 420 may be in a range from about 1p to about 3p. The thickness h of the spacer layer 420 may be, for example, in a range from about 500 nm to about 5 μm.

Figure 7:
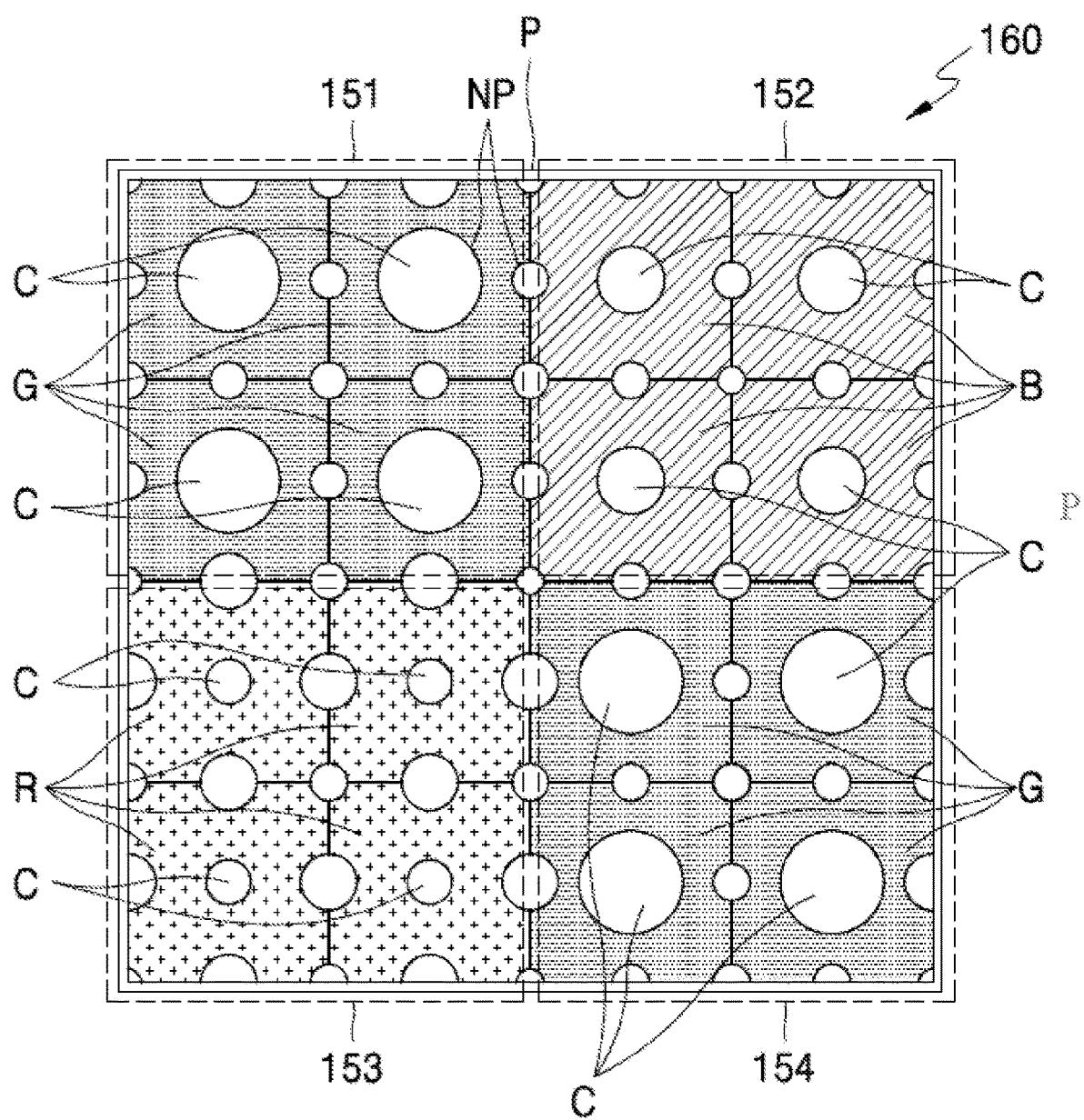
FIG. 7 is a diagram illustrating an example of a periodic region of a color separation element according to an example embodiment.

FIG. 7 schematically illustrates an example of the periodic region 160 of the of the color separation lens array 440. Here, the periodic region 160 indicates a region in which the nano-posts NP are periodically arranged, and may be used to indicate a corresponding pixel region. In addition, a target region for focusing light passing through the color separation lens array 440 may represent a corresponding region of an optical sensor.

The periodic region 160 may include, for example, a first group pixel region 151, a second group pixel region 152, a third group pixel region 153, and a fourth group pixel region 154. The first group pixel region 151 may be a pixel region corresponding to first wavelength light, for example, green light G, the second group pixel region 152 may be a pixel region corresponding to second wavelength light, for example, blue light B, the third group pixel region 153 may be a pixel region corresponding to third wavelength light, for example, red light R, and the fourth group pixel region 154 may be a pixel region corresponding to fourth wavelength light, for example, green light G. The first group pixel region 151 and the fourth group pixel region 154 may be located in a diagonal direction, and the second group pixel region 152 and the third group pixel region 153 may be located in a diagonal direction. Pixels of the first group pixel region 151 may be disposed adjacent to each other. It may be configured that the first wavelength light has a phase of 2Nπ (N is an integer greater than 0) at the center of each pixel of the first group pixel region 151 and the phase may be gradually decreased toward the periphery of the periodic region 160. The pixels PX of the second group pixel region 152 may be disposed adjacent to each other. It may be configured that the second wavelength light has a phase of 2Mπ (M is an integer greater than 0) at the center of each pixel of the second group pixel region 152, and the phase may be gradually decreased toward the periphery of the periodic region 160. The pixels PX of the third group pixel region 153 may be disposed adjacent to each other. It may be configured that the third wavelength light has a phase of 2Lπ (L is an integer greater than 0) at the center of each pixel of the third group pixel region 153, and the phase may be gradually decreased toward the periphery of the periodic region 160. The pixels PX of the fourth group pixel region 154 may be disposed adjacent to each other. It may be configured that the fourth wavelength light has a phase of 2Nπ (N is an integer greater than 0) at the center of each pixel of the fourth group pixel region 154, and the phase may be gradually decreased toward the periphery of the periodic region 160.

Nano-posts NP are arranged in the periodic region 160, and a phase distribution of light that passes through the periodic region 160 may be controlled by the nano-posts NP. A phase distribution region may be a region immediately after passing through the color separation lens array 140. The color separation lens array 440 may diverge incident light by wavelength and control the phase distribution so that the same wavelength light diverged by wavelength is focused on a plurality of target regions, respectively.

An arrangement rule of the nano-posts NP in the first group pixel region 151, an arrangement rule of the nano-posts NP in the second group pixel region 152, an arrangement rule of the nano-posts NP in the third group pixel region 153, and an arrangement rule of the nano-posts NP in the fourth group pixel region 154 may be different from each other. Alternatively, when the first group pixel region 151 and the fourth group pixel region 154 are regions for green light G, the nano-posts NP in the first group pixel region 151 and the fourth group pixel region 154 may have an arrangement of an origin symmetry. However, the arrangement of the nano-posts NP is not limited thereto, and various arrangements are possible.

The nano-post NP may have a shape dimension of a sub-wavelength. Here, the sub-wavelength denotes a wavelength less than a wavelength band used. The nano-post NP may have a shape dimension, for example, less than the shortest wavelength among a first wavelength, a second wavelength, and a third wavelength.

For example, cross-sectional areas of a nanostructure p1 disposed at the center of each pixel of the first group pixel region 151 and a nanostructure p4 disposed at the center of each pixel of the fourth group pixel region 154 may be greater than a cross-sectional area of a nanostructure p2 disposed at the center of each pixel of the second group pixel region 152 or a nanostructure p3 disposed at the center of each pixel of the third group pixel region 153. The cross-sectional area of the nanostructures p2 disposed at the center of each pixel of the second group pixel region 152 may be greater than a cross-sectional area of a nanostructures p3 disposed at the center of each pixel of the third group pixel region 153. However, this is only an example, and, if necessary, nano-posts NP of various shapes, sizes, and arrangements may be applied. Here, the cross-sectional area denotes an area of a cross-section perpendicular to a height direction (Z direction) of the nano-post NP.

The nano-post NP provided in the first and fourth group pixel regions 151 and 154 may have different rules of distribution in the first direction (X direction) and the second direction (Y direction). For example, the nano-posts NP disposed in the first and fourth group pixel regions 151 and 154 may have different size arrangements in the first direction (X direction) and the second direction (Y direction). The arrangement of nanostructures located at a boundary between the first group pixel region 151 and the second group pixel region 152 and the arrangement of the nanostructures located at a boundary between the first group pixel region 151 and the third group pixel region 153 may be different from each other. The arrangement of nanostructures NP located at a boundary between the fourth group pixel region 154 and the third group pixel region 153 and the arrangement of the nano-posts NP located at a boundary between the fourth group pixel region 154 and the second group pixel region 152 may be different from each other.

The nano-posts NP disposed in the second group pixel region 152 and the third group pixel region 153 may have a symmetrical distribution rule in the first direction (X direction) and the second direction (Y direction). The nano-posts NP located at the boundary between the second group pixel region 152 and the first group pixel region 151 and the nano-posts NP located at the boundary between the second group pixel region 152 and the fourth group pixel region 154 may have the same arrangement.

The nano-posts NP located at the boundary between the third group pixel region 153 and the first group pixel region 151 and the nano-posts NP located at the boundary between the third group pixel region 153 and the fourth group pixel region 154 may have the same arrangement.

In the first group pixel region 151 and the fourth group pixel region 154, for example, the nano-posts NP may be arranged in a form of a 2-fold symmetry. For example, the first group pixel region 151 and the fourth group pixel region 154 may have an array of nano-posts NP rotated 90 degrees with respect to each other.

In the second group pixel region 152 and the third group pixel region 153, the nano-posts NP may be arranged in a form of 4-fold symmetry. For example, in the second group pixel region 152 and the third group pixel region 153, the nano-posts NP may be arranged in an X direction symmetrical, a Y direction symmetrical, and two diagonally symmetrical structures. However, the arrangements are only examples, and are not limited thereto.

Figure 8:
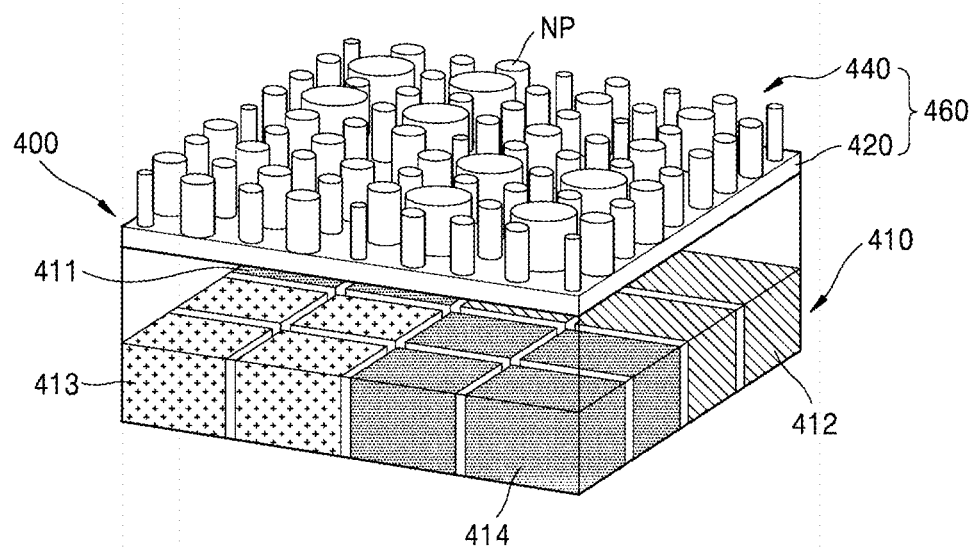
FIG. 8 is a schematic diagram of an image sensor according to an example embodiment.

FIG. 8 illustrates an image sensor according to an example embodiment. The image sensor 400 may include a color separation element 460 and an optical sensor 410 including a plurality of photosensitive cells for sensing light. Light of each wavelength separated by the color separation element 460 may be focused on a corresponding region of the optical sensor 410.

The optical sensor 410 may have, for example, a photosensitive cell array structure corresponding to the pixel arrangement structure of FIG. 3A. The optical sensor 410 may include a first photosensitive cell 411 that senses a first wavelength light, a second photosensitive cell 412 that senses a second wavelength light, and a third photosensitive cell that senses a third wavelength, and a fourth photosensitive cell 414 for sensing the first wavelength light. For example, the optical sensor 410 may include a 2×2 green sensing cell 411, a 2×2 blue sensing cell 412, a 2×2 red sensing cell 413, and a 2×2 green sensing cell 414.

An operation of focusing light on the optical sensor 410 will be described. Incident light is separated for each wavelength by the color separation element 460, and wavelength light may be focused on a sensing cell corresponding to each wavelength. In an example embodiment, the color separation lens array 440 may form a phase distribution in which light of two or more different wavelengths included in incident light is diverged in different directions and focused. For example, the shape, size, and arrangement of the nano-posts NP may be configured so that the first wavelength light included in the incident light has a first phase distribution, the second wavelength light has a second phase distribution, and the third wavelength light has a third phase distribution.

For example, the color separation element 460 may diverge incident light into green light, blue light, and red light. The diverged green light may be focused on the 2×2 green light sensing cell 411, the diverged blue light may be focused on the 2×2 blue light sensing cell 412, the diverge red light may be focused on the 2×2 red light sensing cell 413, and the diverge green light may be focused on the 2×2 green light sensing cell 414.

Figure 9:
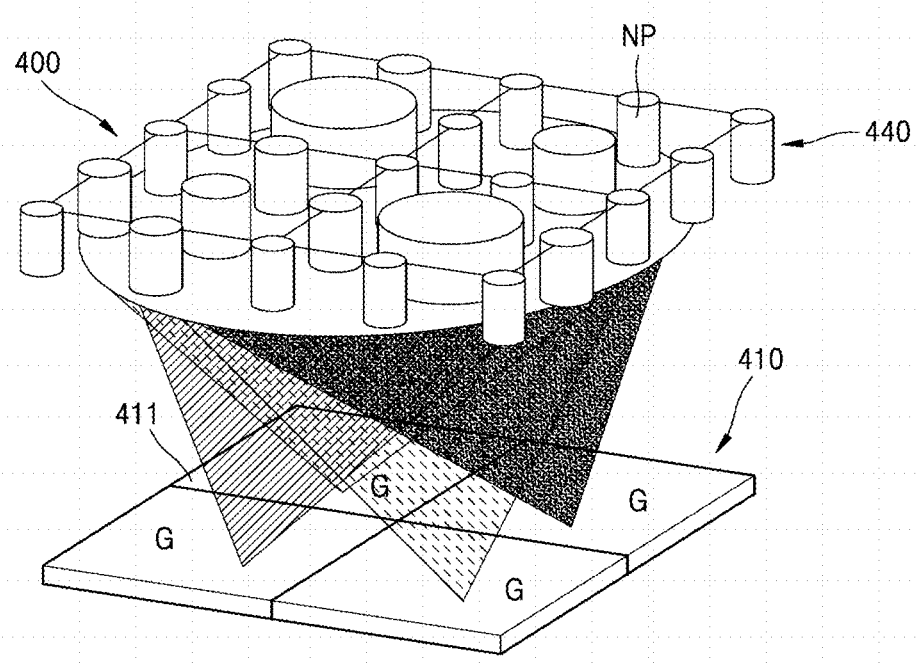
FIG. 9 is a diagram illustrating a multiple focusing by a color separation element according to an example embodiment.

FIG. 9 shows, for example, focusing of light with respect to the first photosensitive cell 411 that senses first wavelength light by the color separation lens array 440. The first photosensitive cell 411 may be, for example, a 2×2 green light sensing cell. The color separation lens array 440 may focus green light G on each pixel region of the 2×2 first photosensitive cell 411 by the nano-posts NP. In this way, the color separation element 460 may perform multiple focusing with respect to the same wavelength light.

In FIG. 9, multiple focusing with respect to green light G is shown, but according to another example embodiment, multiple focusing with respect to other wavelength light, for example, blue light B and red light R, may also be implemented.

Figure 10:
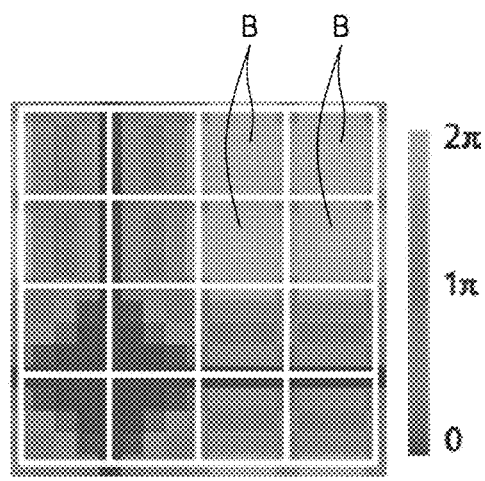
FIG. 10 is a diagram illustrating a phase distribution of first wavelength light in a periodic region of a color separation element according to an example embodiment.
Figure 11:
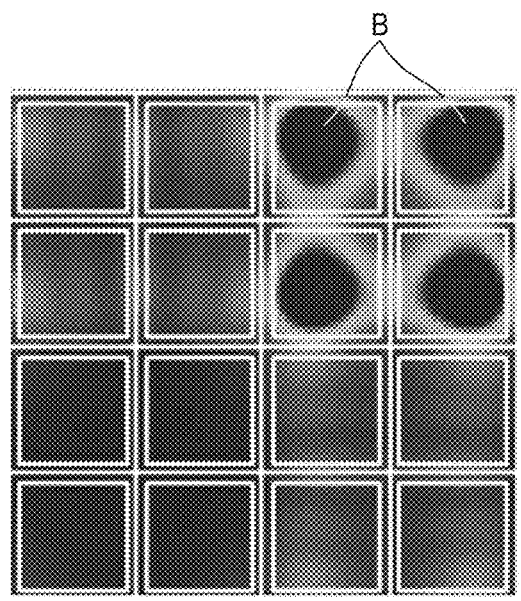
FIG. 11 is a diagram illustrating a multiple focusing of first wavelength light in a periodic region of a color separation element according to an example embodiment.

FIG. 10 shows a phase distribution of blue light B immediately after incident light passes through a color separation element. The phase distribution may correspond to a 4×4 pixel region of the periodic region 160 illustrated in FIG. 3A. A phase of blue light B is distributed in each pixel of a 2×2 blue pixel region, and, for example, a $2\pi$ phase is distributed at the center of each pixel. FIG. 11 shows multiple focusing characteristics of blue light B according to the phase distribution of blue light B shown in FIG. 10.

Figure 12:
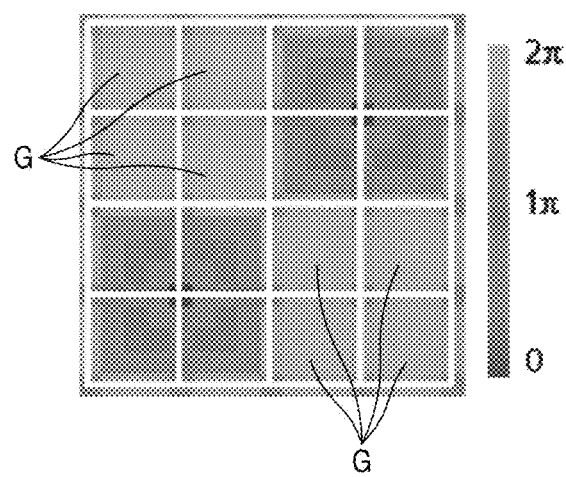
FIG. 12 is a diagram illustrating a phase distribution of second wavelength light in a periodic region of a color separation element according to an example embodiment.
Figure 13:
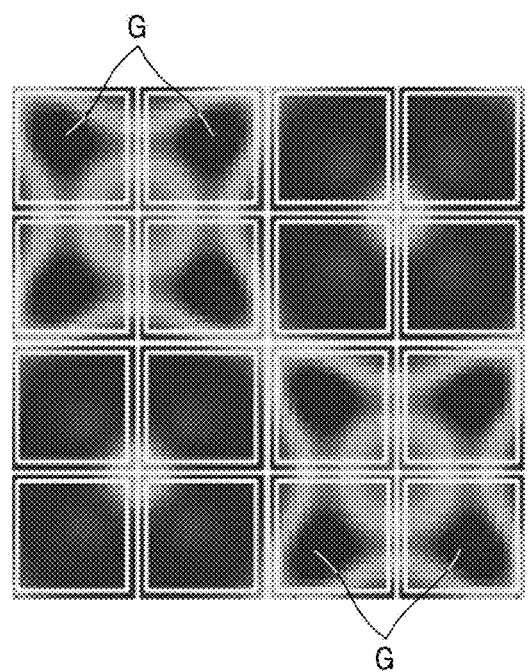
FIG. 13 is a diagram illustrating multiple focusing of second wavelength light in a periodic region of a color separation element according to an example embodiment.

FIG. 12 shows a phase distribution of green light G after incident light passes through a color separation element. The phase distribution may correspond to a 4×4 pixel region of the periodic region 160 illustrated in FIG. 3A. A phase of blue light B may be distributed in each pixel of the 2×2 blue pixel region, and, for example, a $2\pi$ phase may be distributed at the center of each pixel. FIG. 13 shows multiple focusing characteristics of green light G according to the phase distribution of green light G shown in FIG. 12.

Figure 14:
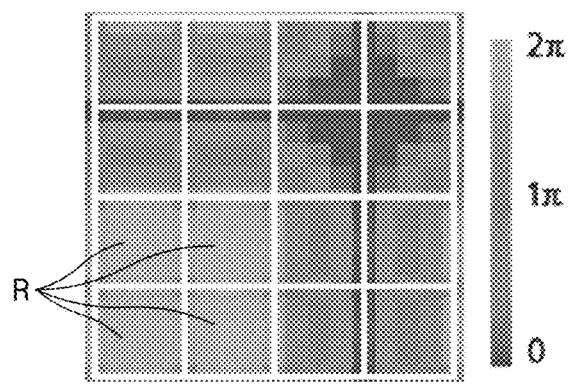
FIG. 14 is a diagram illustrating a phase distribution of third wavelength light in a periodic region of a color separation element according to an example embodiment.
Figure 15:
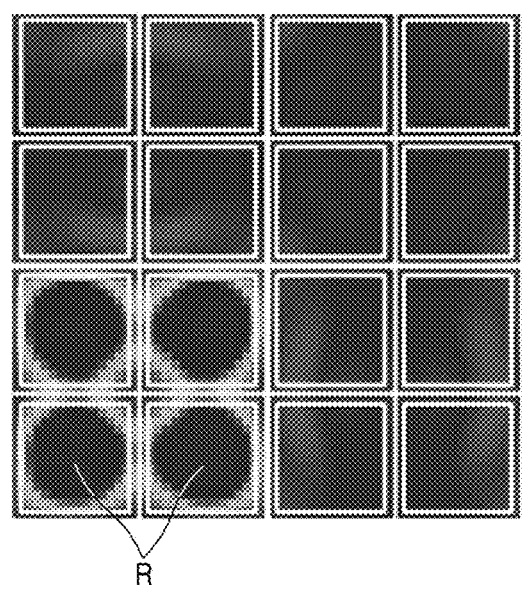
FIG. 15 is a diagram illustrating multiple focusing of third wavelength light in a periodic region of a color separation element according to an example embodiment.

FIG. 14 shows a phase distribution diagram of red light R after incident light passes through a color separation element. The phase distribution may correspond to a 4×4 pixel region of the periodic region 160 illustrated in FIG. 3A. A phase of the red light R may be distributed in each pixel of the 2×2 red pixel region, and, for example, a $2\pi$ phase may be distributed at the center of each pixel. FIG. 15 shows multiple focusing characteristics of red light R according to the phase distribution of red light R shown in FIG. 14.

Figure 16:
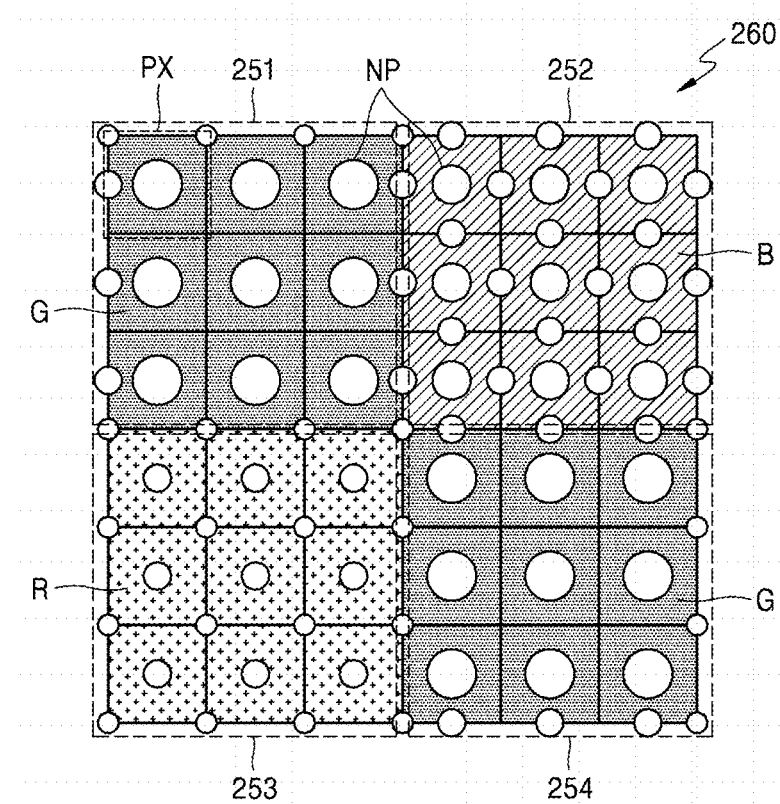
FIG. 16 is a diagram illustrating another example a periodic region of a color separation element according to an example embodiment.

FIG. 16 shows another arrangement structure of a periodic region 260. Nano-posts NP are arranged in the periodic region 260. The periodic region 260 may include, for example, a first group pixel region 251, a second group pixel region 252, a third group pixel region 253, and a fourth group pixel region 254. The first group pixel region 251 may be a pixel region corresponding to first wavelength light, for example, green light G, and may include 3×3 pixels PX. The second group pixel region 252 may be a pixel region corresponding to second wavelength light, for example, blue light B, and may include 3×3 pixels PX. The third group pixel region 253 may be a pixel region corresponding to third wavelength light, for example, red light R, and may include 3×3 pixels PX. The fourth group pixel region 154 may be a pixel region corresponding to fourth wavelength light, for example, green light G, and may include 3×3 pixels PX. The first group pixel region 251 and the fourth group pixel region 254 may be located in a diagonal direction, and the second group pixel region 252 and the third group pixel region 253 may be located in a diagonal direction.

Nano-posts NP are arranged in the periodic region 260, and a phase distribution of light passing through the periodic region 260 may be controlled by the nano-posts NP. According to the arrangement of the nano-posts NP, incident light may be diverged by wavelength, and the phase distribution may be controlled so that the same wavelength light diverged by wavelength is multi-focused onto a plurality of target regions, respectively.

Figure 17:
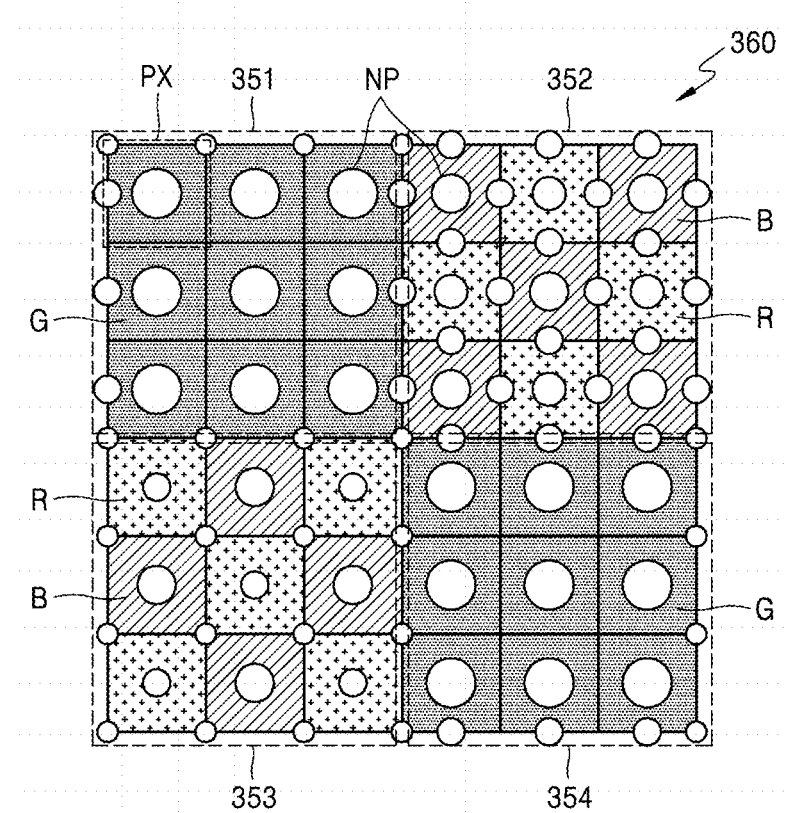
FIG. 17 is a diagram illustrating still another example of a periodic region of a color separation element according to an example embodiment.

FIG. 17 shows another arrangement structure of a periodic region 360. Nano-posts NP are arranged in the periodic region 360. The periodic region 360 may include, for example, a first group pixel region 351, a second group pixel region 352, a third group pixel region 353, and a fourth group pixel region 354. The first group pixel region 351 may be a pixel region corresponding to first wavelength light, for example, green light G, and may include 3×3 pixels PX. The second group pixel region 352 may be a region in which pixels of second wavelength light and third wavelength light are alternately arranged, and may include 3×3 pixels. For example, in the second group pixel region 352, blue light (B) pixels and red light (R) pixels may be alternately arranged.

The third group pixel region 353 may include a 3×3 pixel structure in which pixels of different wavelength light are alternately arranged. For example, in the third group pixel region 353, blue light B pixels and red light R pixels may be alternately arranged. The arrangement structure of the nano-posts NP of the second group pixel region 352 and the third group pixel region 353 may be different from each other.

The fourth group pixel region 354 may be a pixel region corresponding to fourth wavelength light, for example, green light G, and may include 3×3 pixels.

The nano-posts NP are arranged in the periodic region 360, and a phase distribution of light that passes through the periodic region 360 may be controlled by the nano-posts NP. In the first group pixel region 351, green light G may be multi-focused onto each pixel PX in corresponding regions. In the second group pixel region 352, blue light B and red light R may be diverged and focused on each target region, blue light B may be focused on the corresponding blue light pixel region, and red light R may be focused on the corresponding red light pixel region, respectively. In the second group pixel region 352, blue light B may be focused on blue light pixel regions adjacent in a diagonal direction, and red light R may be focused on red light pixel regions adjacent in a diagonal direction. In the third group pixel region 353, as in the second group pixel region 352, blue light B and red light R respectively may be multi-focused on corresponding pixel regions. In the fourth group pixel region 354, green light G may be multi-focused onto each pixel PX of a corresponding region.

Figure 18:
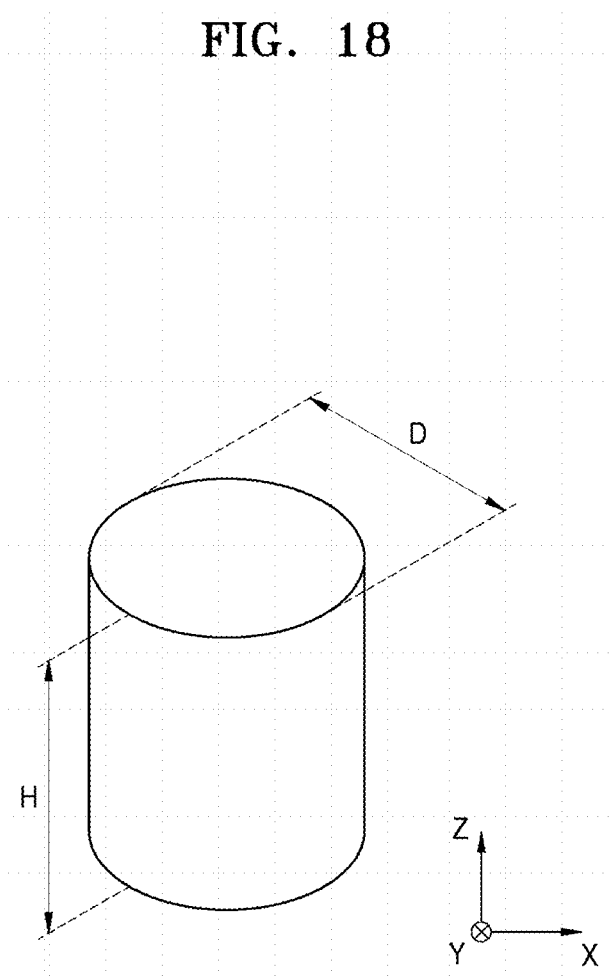
FIG. 18 is a diagram illustrating an example of a cylindrical nano-post used in a color separation element of an image sensor according to an example embodiment.

FIG. 18 is a perspective view showing an example form of a nano-post that may be employed in the color separation lens array 440 of an image sensor according to an example embodiment. Referring to FIG. 18, the nano-post may have a cylindrical shape having a diameter D and a height H. At least one of the diameter D and the height H may be a sub-wavelength. The diameter D may vary depending on where the nano-post is placed.

According to other example embodiment, the nano-post may be formed as a pillar having various cross-sectional shapes. FIGS. 19A to 19H are plan views showing shapes of nano-posts that may be employed in the color separation lens array 440 of an image sensor.

Figure 19A:
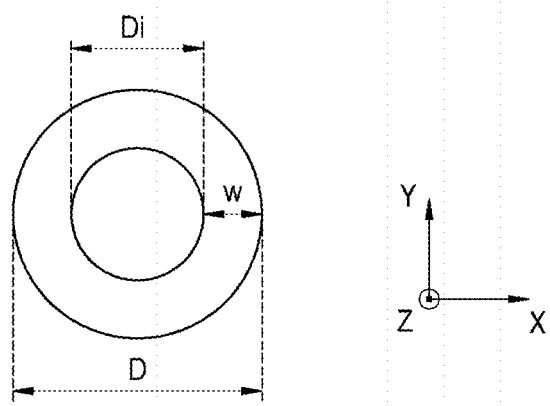
FIG. 19A to 19H illustrate examples of nano-posts used in a color separation element of an image sensor according to an example embodiment.

As shown in FIG. 19A, a cross-section of the nano-post may have a circular ring shape having an outer diameter D and an inner diameter Di. The ring may have a width w which may be a sub-wavelength.

Figure 19B:
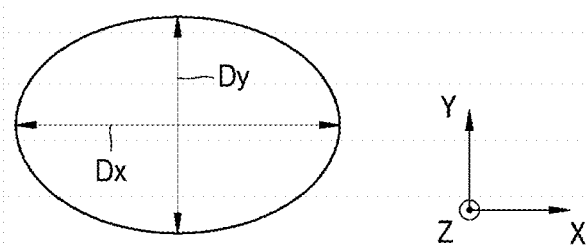

As shown in FIG. 19B, a cross-section of the nano-post may have an oval shape in which lengths of the major axis and minor axis in the first direction (X direction) and the second direction (Y direction) are different from each other by Dx and Dy. Such a shape may be employed, for example, in the first region 161 and the fourth region 164 corresponding to green pixels.

Figure 19C:
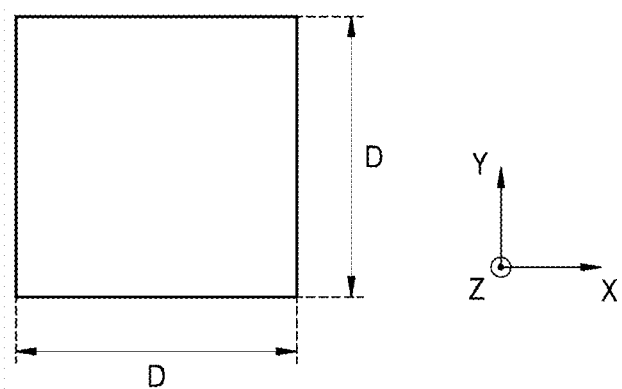
Figure 19D:
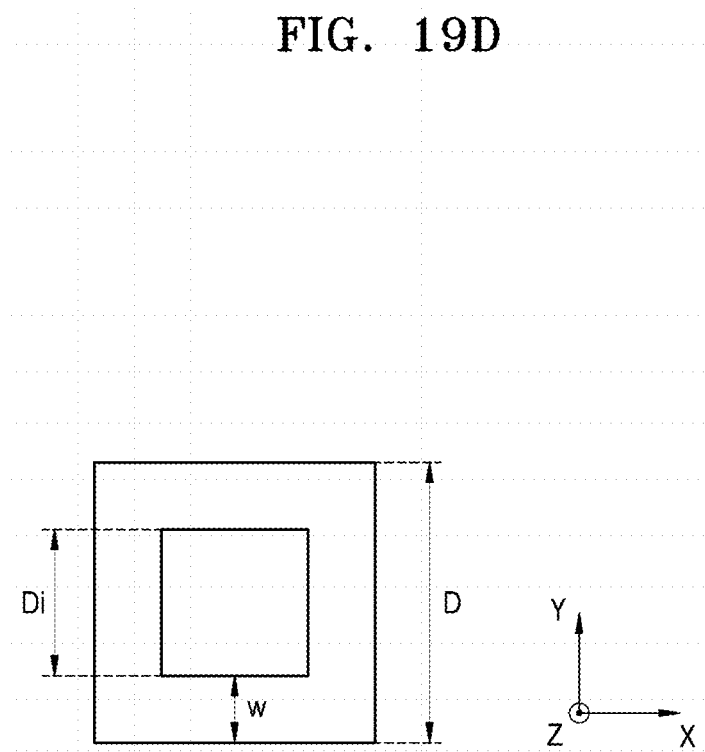
Figure 19E:
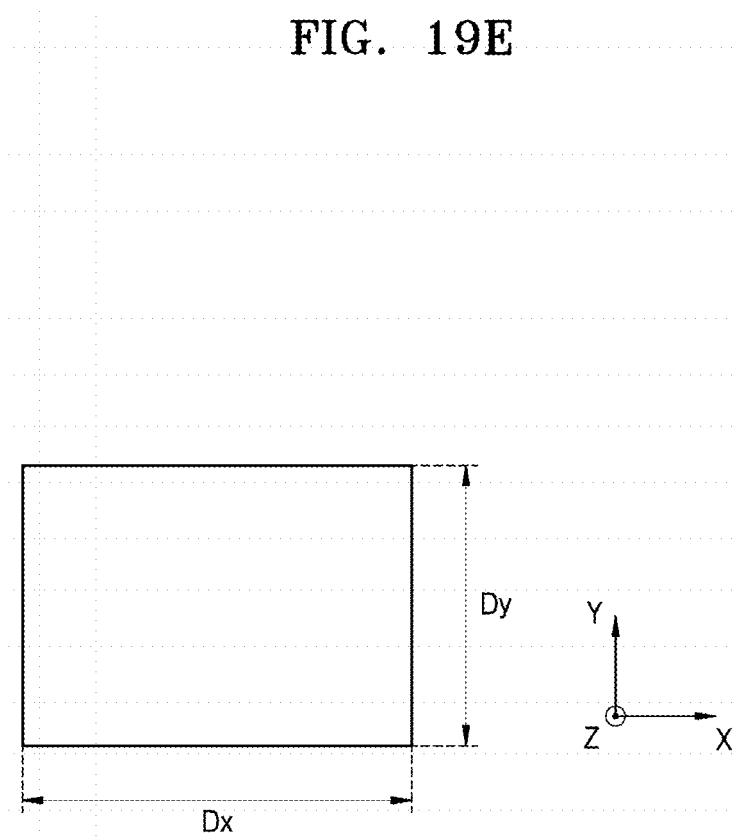
Figure 19F:
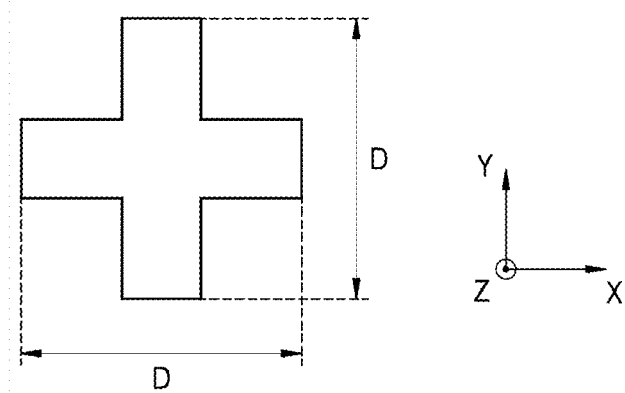

As shown in FIGS. 19C, 19D, and 19F, the cross-sectional shape of the nano-post may include a square shape, a square ring shape, or a cross shape.

Figure 19G:
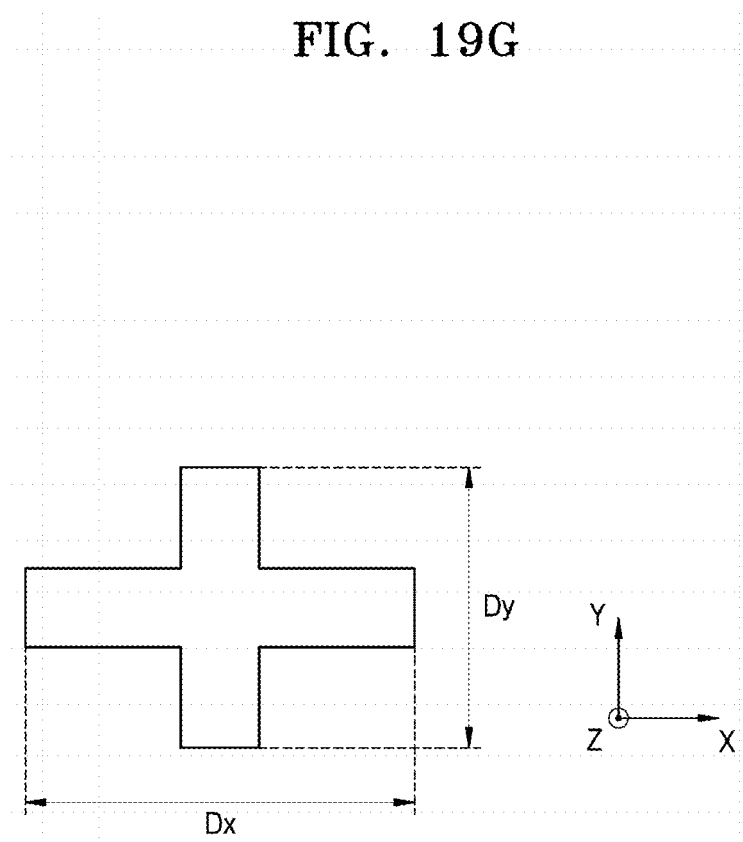

As shown in FIGS. 19E and 19G, the cross-sectional shape of the nano-post may include a rectangular shape or a cross shape in which the lengths of the first direction (X direction) and the second direction (Y direction) are different from each other by Dx and Dy. Such a shape may be employed, for example, in the first region 161 and the fourth region 164 corresponding to green pixels.

Figure 19H:
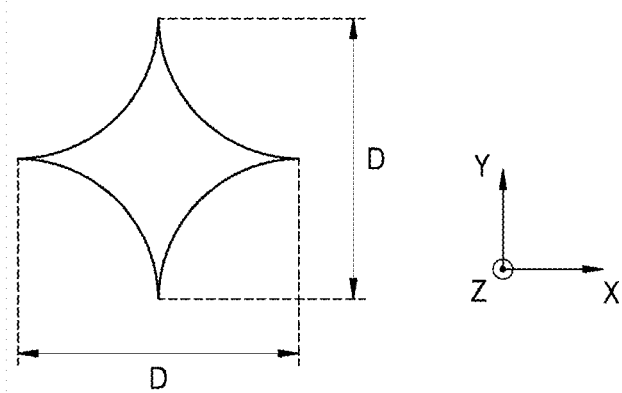

Also, as shown in FIG. 19H, the cross-sectional shape of the nano-post may be a shape having a plurality of concave arcs.

Figure 20:
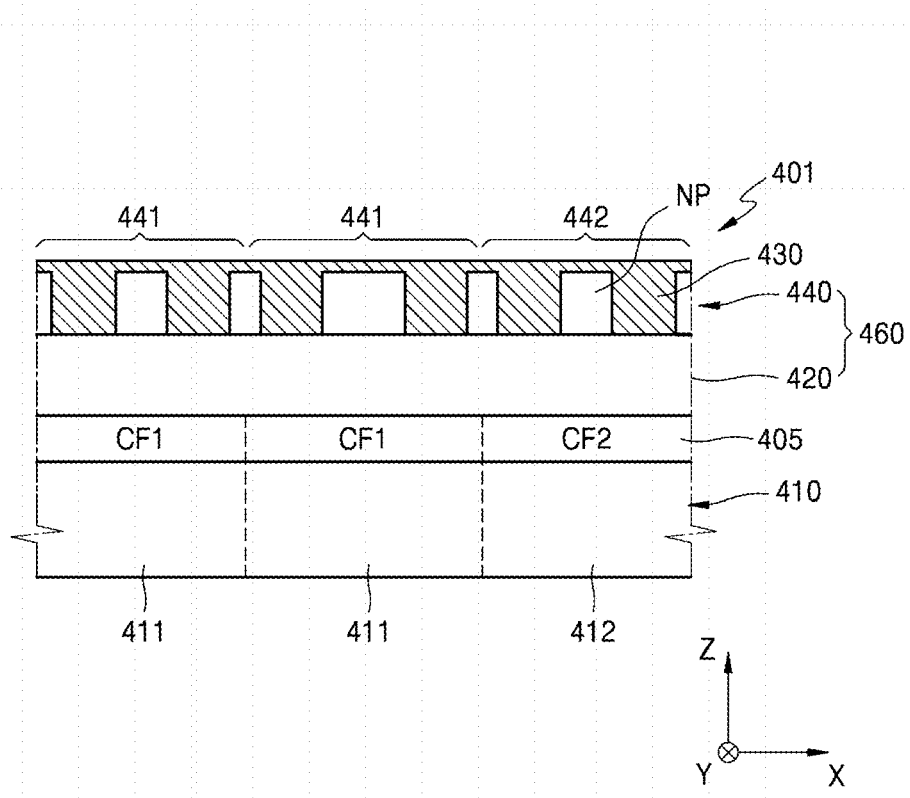
FIGS. 20 and 21 are schematic cross-sectional views illustrating an example of color filter further provided in the image sensor illustrated in FIGS. 4 and 5.
Figure 21:
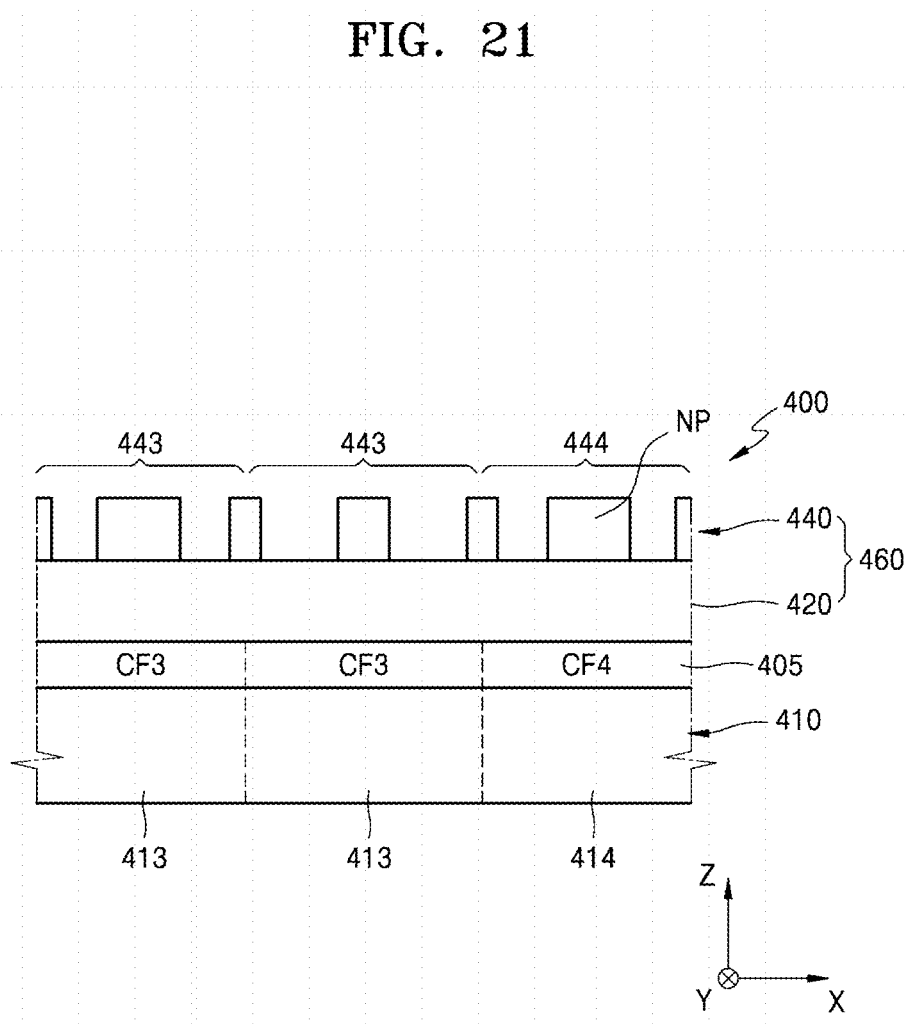

FIGS. 20 and 21 are schematic cross-sectional views of structures of image sensors 401 and 400 according to another example embodiment. FIG. 20 is a cross-sectional view taken along line A-A of FIG. 3A, and FIG. 21 is a cross-sectional view taken along line B-B of FIG. 3A.

FIG. 20 illustrates a schematic structure of the image sensor 401 according to another example embodiment.

The image sensor 401 according to the example embodiment shows an example in which a color filter 405 is further included in the image sensor 400 shown in FIG. 4. The color filter 405 may further be disposed between the optical sensor 410 and the color separation element 460.

The color filter 405 may be configured to filter wavelength light corresponding to each pixel. For example, the color filter 405 may include a first color filter CF1, a second color filter CF2, and a third color filter CF3.

According to an example embodiment, even though, the configuration of the color filter 405 may not diverge or focus light having different wavelengths on the first to fourth photosensitive cells 411, 412, 413, and 414, since the color filter 405 is additionally provided, color purity may further be supplemented, and in this case, the amount of incident light for each color may be reduced.

A dielectric layer 430 may further be provided on the color separation lens array 440. The dielectric layer 430 may be disposed to completely cover spaces between adjacent nano-posts NP and an upper surface of the nano-posts NP. The dielectric layer 430 may include a material having a refractive index less than that of the nano-posts NP. For example, the dielectric layer 430 may include the same material as the spacer layer 420.

The image sensor according to the example embodiments may be employed in various image sensors or electronic devices, such as a camera. The electronic device may be, for example, a smart phone, a mobile phone, a personal digital assistant (PDA), a laptop, a PC, various portable devices, and other mobile or non-mobile computing devices, but is not limited thereto.

Figure 22:
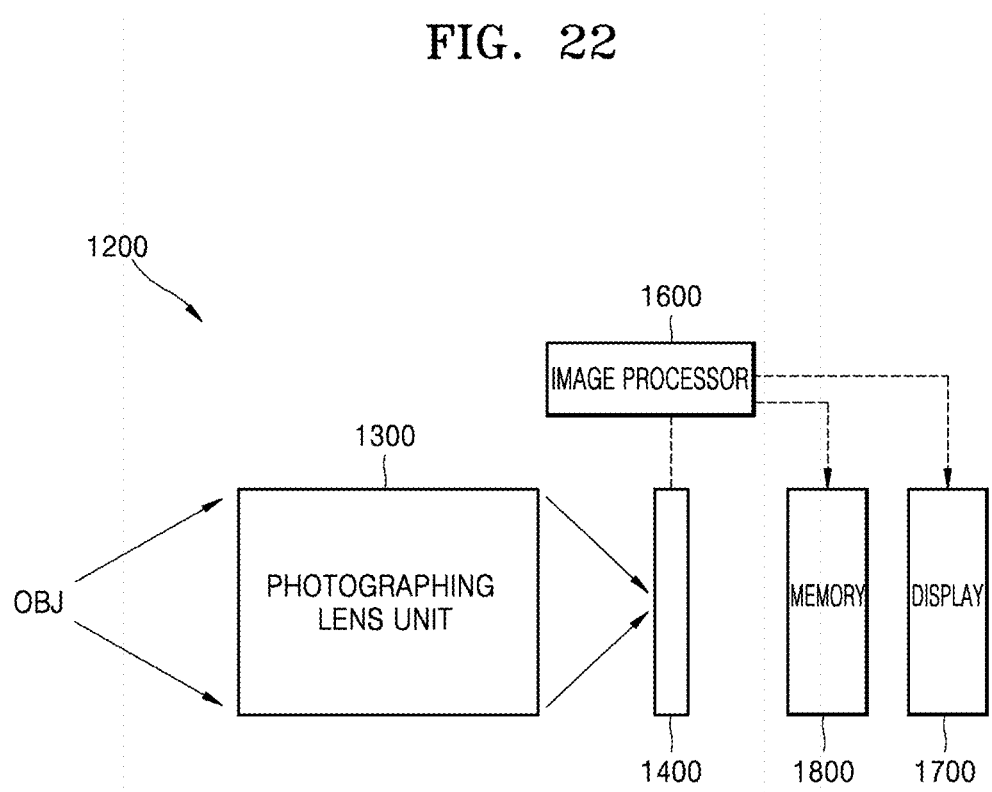
FIG. 22 is a schematic block diagram of an image sensor according to an example embodiment.

FIG. 22 is a schematic block diagram of a configuration of an image sensor 1200 according to an example embodiment.

The image sensor 1200 may include an imaging lens unit 1300 forming an optical image by focusing light reflected from an object OBJ and an image sensor 1400 that converts an optical image formed in the imaging lens unit 1300 into an electrical signal. An infrared cut filter may further be disposed between the image sensor 1400 and the imaging lens unit 1300.

The image sensor described with reference to FIGS. 1 to 21 may be employed as the image sensor 1400. The image sensor 1200 also includes an image processor 1600 that processes an electrical signal from the image sensor 1400 into an image signal. The image processor 1600 forms an image by performing operations, such as noise removal, color interpolation, etc. with respect to signals for each color sensed by the image sensor 1400. The image sensor 1000 may further include a display unit 1700 that displays an image formed by the image processor 1600 and a memory 1800 that stores image data formed by the image processor 1600. According to an example embodiment, the image processor 1600 may be a central processing unit (CPU) that performs the respective functions, a microprocessor, or the like.

Figure 23:
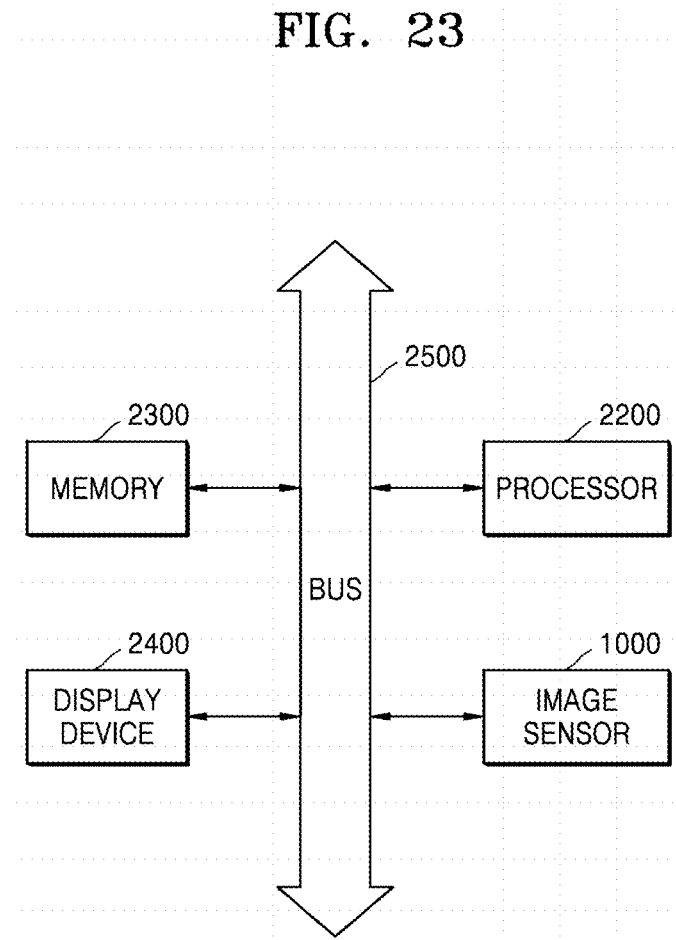
FIG. 23 is a schematic block diagram of an electronic device including an image sensor according to example embodiments.

FIG. 23 is a schematic block diagram of an electronic device including an image sensor according to example embodiments. The electronic device includes an image sensor 1000, a processor 2200, a memory 2300, a display device 2400, and a bus 2500. The image sensor 1000 acquires image information on an external object under the control of the processor 2200 and provides the image information to the processor 2200. The processor 2200 may store the image information provided from the image sensor 1000 in the memory 2300 through the bus 2500. The processor 2200 may output the image information stored in the memory 2300 to the display device 2400 to display the image information to a user. Also, as described above, the processor 2200 may perform various image processing on the image information provided from the image sensor 1000.

FIGS. 24 to 36 show examples of various multimedia devices, which are electronic devices to which image sensors according to example embodiments are applied.

Figure 24:
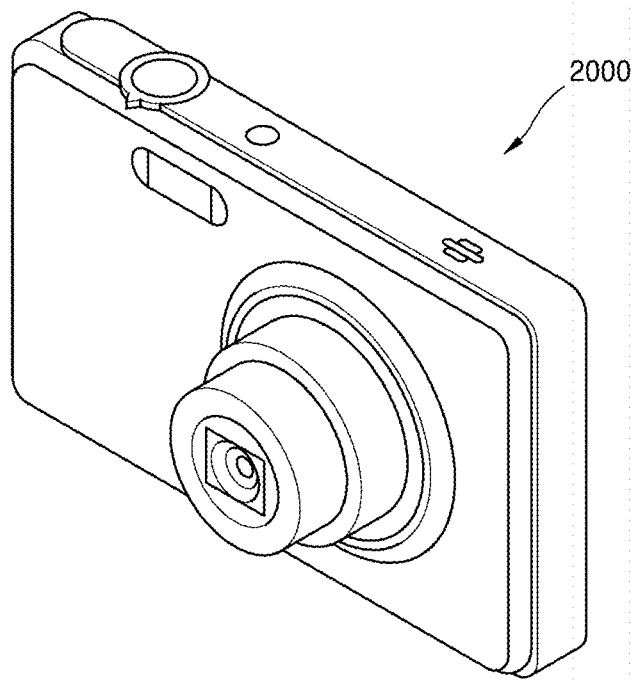
FIGS. 24 to 34 show examples of electronic devices to which image sensors according to the example embodiments are applied.

Image sensors according to example embodiments may be applied to various multimedia devices having an image capturing function. For example, the image sensor may be applied to a camera 2000 as shown in FIG. 24. The camera 2000 may be a digital camera or a digital camcorder.

Figure 25:
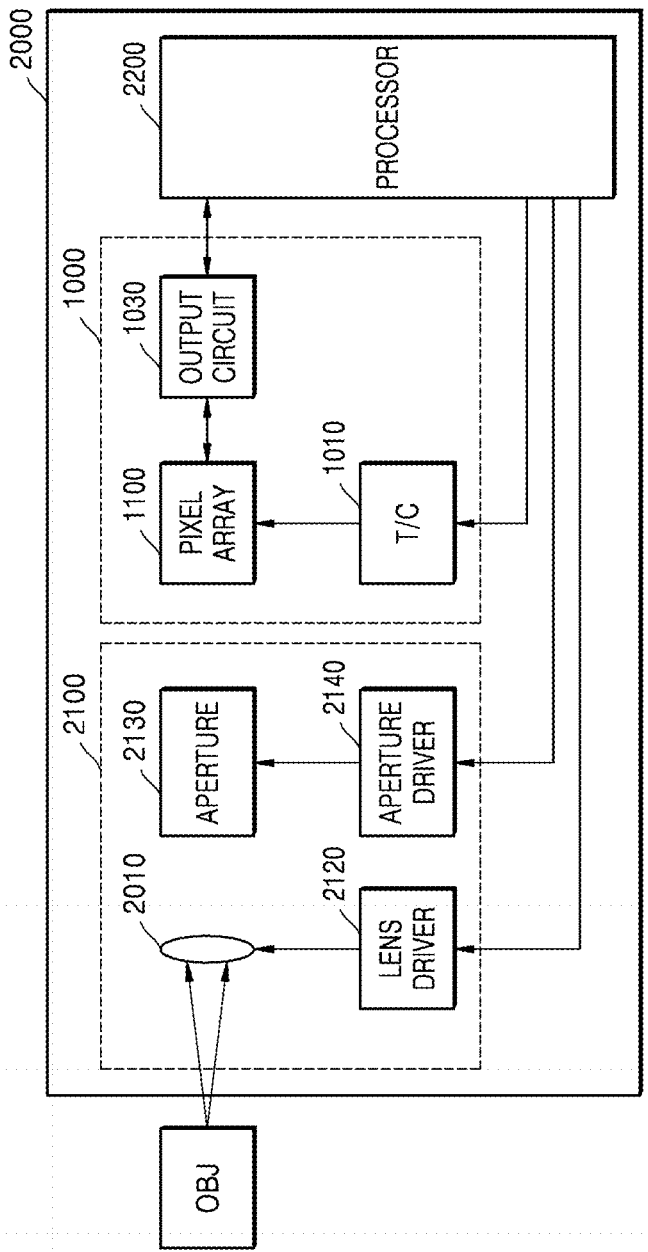

Referring to FIG. 25, the camera 2000 may include an imaging unit 2100, an image sensor 1000, and a processor 2200.

The imaging unit 2100 forms an optical image by focusing light reflected from an object OBJ. The imaging unit 2100 may include an objective lens 2010, a lens driving unit 2120, an aperture 2130, and an aperture driving unit 2140. In FIG. 25, although only one lens element is representatively shown for convenience, but in fact, the objective lens 2010 may include a plurality of lens elements having different sizes and shapes. The lens driving unit 2120 may communicate information about focus detection with the processor 2200 and may control the location of the objective lens 2010 according to a control signal provided from the processor 2200. The lens driving unit 2120 may control a distance between the objective lens 2010 and the object OBJ by moving the objective lens 2010, or control positions of individual lens elements in the objective lens 2010. A focus on the object OBJ may be controlled by driving the objective lens 2010 by the lens driving unit 2120. The camera 2000 may have an auto-focus function.

Also, the aperture driving unit 2140 may communicate information on an amount of light with the processor 2200 and may control the aperture 2130 according to a control signal provided from the processor 2200. For example, the aperture driving unit 2140 may increase or decrease a size of the aperture 2130 according to the amount of light entering the camera 2000 through the objective lens 2010, and control an opening time of the aperture 2130.

The image sensor 1000 may generate an electrical image signal based on the intensity of incident light. The image sensor 1000 may include a pixel array 1100, a timing controller 1010, and an output circuit 1030. According to an example embodiment, the image sensor 1000 may further include a row decoder shown in FIG. 1. Light transmitted through the objective lens 2010 and the aperture 2130 may form an image of the object OBJ on a light-receiving surface of the pixel array 1100. The pixel array 1100 may be a CCD or CMOS that converts optical signals into electrical signals. The pixel array 1100 may include additional pixels for performing an AF function or a distance measurement function. Also, the pixel array 1100 may include the color separation lens array described above.

The processor 2200 may control an overall operation of the camera 2000 and may have an image processing function. For example, the processor 2200 may provide a control signal for operating each constituent element of the lens driving unit 2120, the aperture driving unit 2140, and the timing controller 1010.

Figure 26:
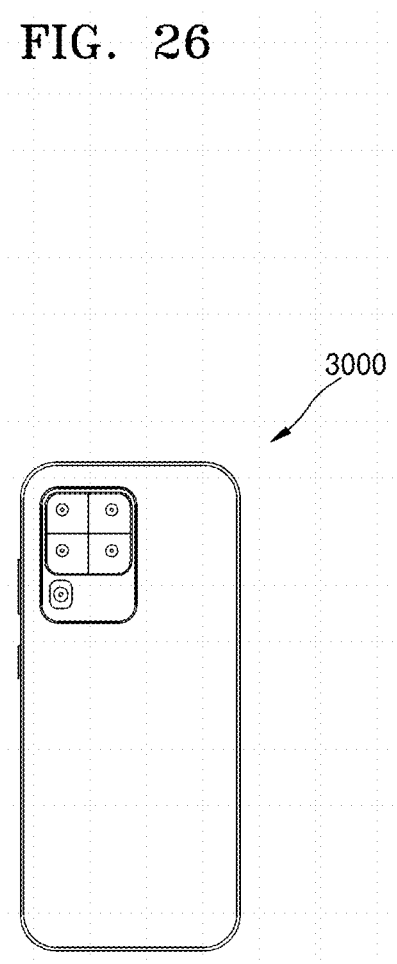
Figure 27:
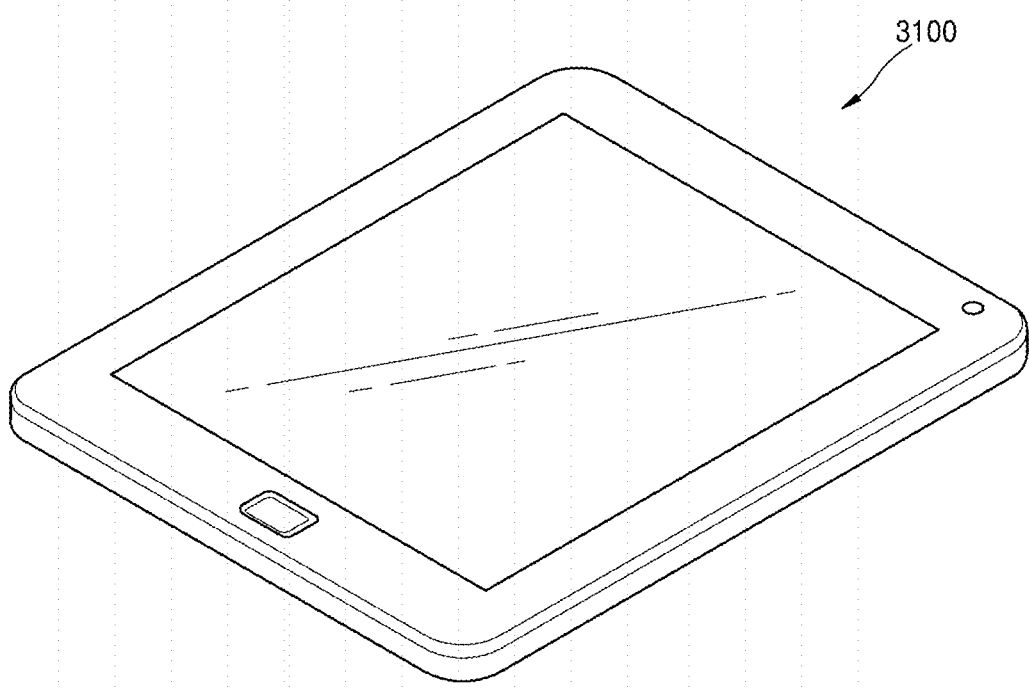
Figure 28:
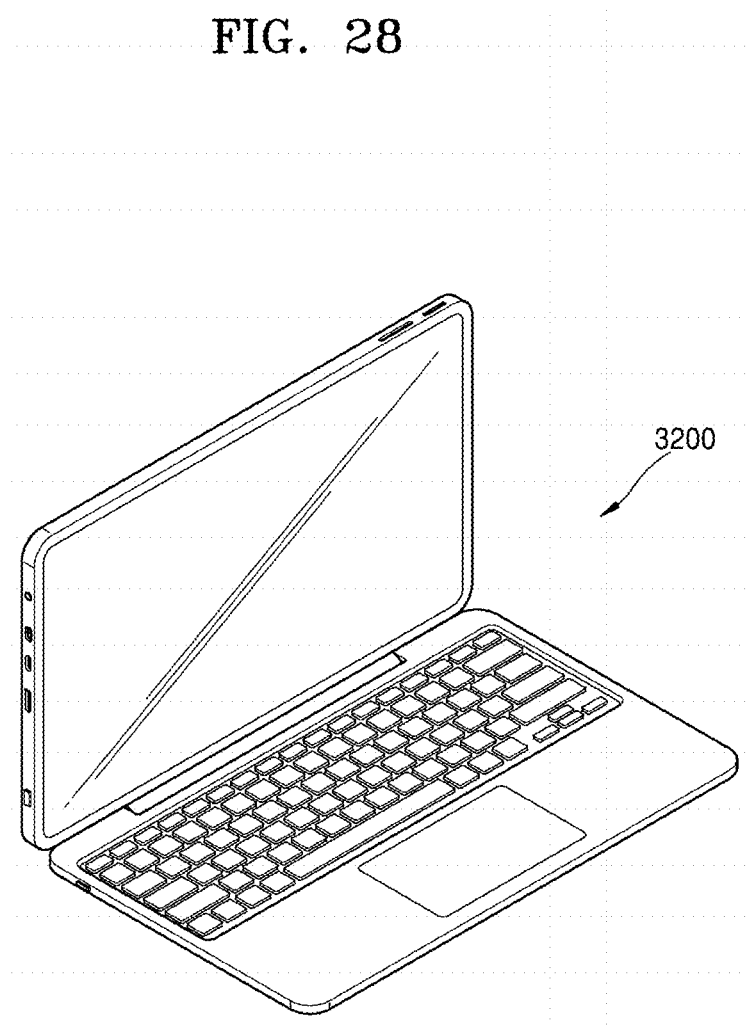
Figure 29:
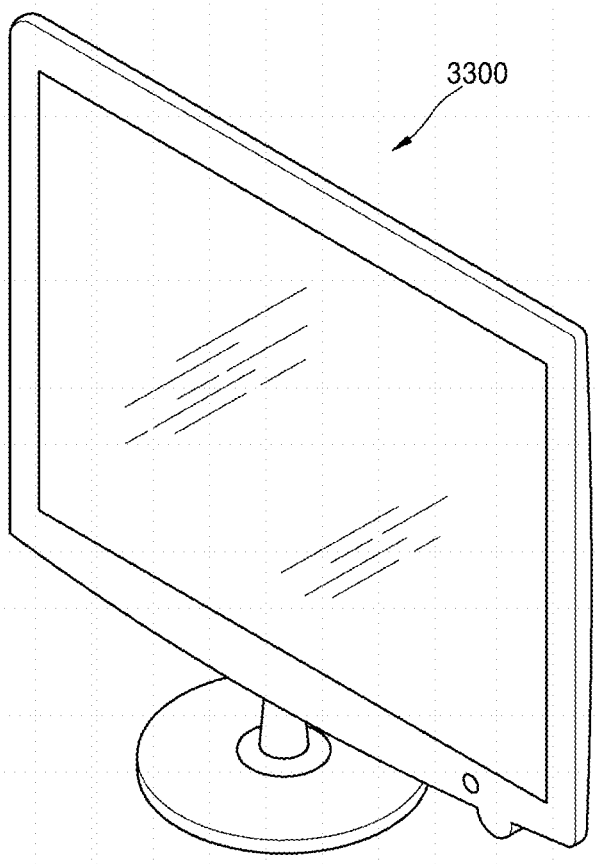

Also, the image sensor according to the example embodiments may be applied to a mobile phone or smart phone 3000 as shown in FIG. 26, and may be applied to a tablet or smart tablet 3100 as shown in FIG. 27. Also, the image sensor according to the example embodiments may be applied to a notebook computer 3200 as shown in FIG. 28, and may be applied to a television or a smart television 3300 as shown in FIG. 29.

For example, the smart phone 3000 or the smart tablet 3100 may include a plurality of high-resolution cameras each equipped with a high-resolution image sensor. By using a high-resolution camera, depth information of objects in an image may be extracted, out-focusing of an image may be controlled, or objects in an image may be automatically identified.

Figure 30:
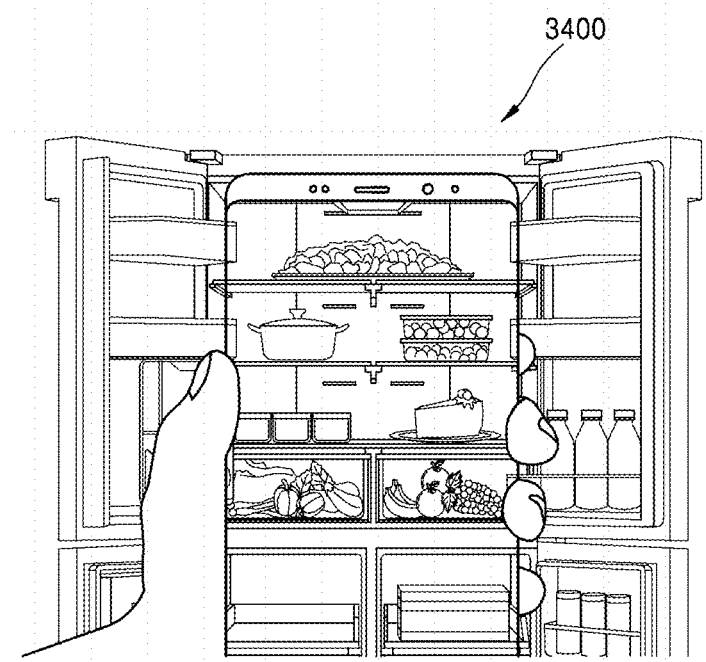
Figure 31:
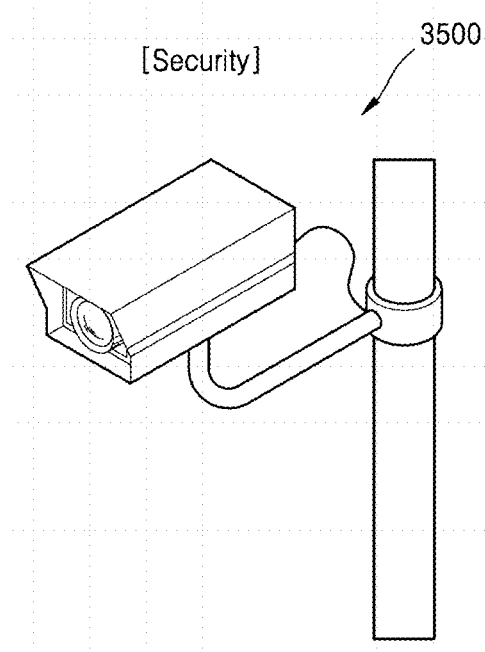
Figure 32:
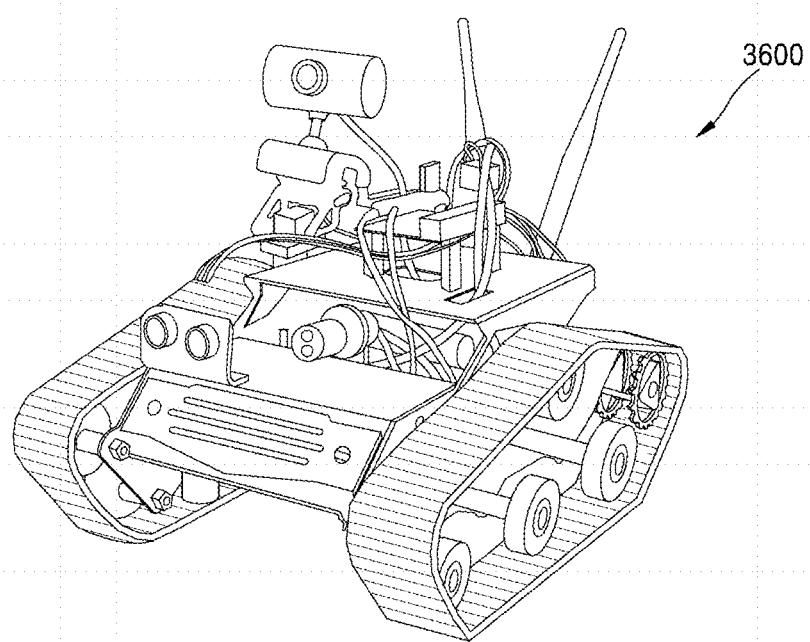
Figure 33:
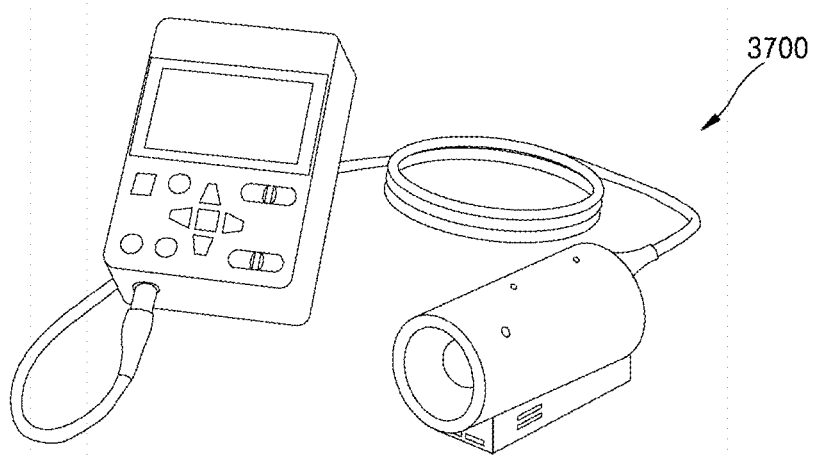

Also, the image sensor may be applied to a smart refrigerator 3400 as shown in FIG. 30, a security camera 3500 as shown in FIG. 31, a robot 3600 as shown in FIG. 32, a medical camera 3700 as shown in FIG. 33, etc. For example, the smart refrigerator 3400 may automatically recognize food therein by using an image sensor, and inform the existence of a specific food, the kind of food in or out, etc. to the user through a smartphone. The security camera 3500 may provide an ultra-high resolution image and may be able to recognize an object or person in an image even in a dark environment by using high sensitivity. The robot 3600 may provide a high-resolution image by being input to a disaster or industrial site where humans may not be directly accessed. The medical camera 3700 may provide a high-resolution image for diagnosis or surgery, and may dynamically control a field of view.

Figure 34:
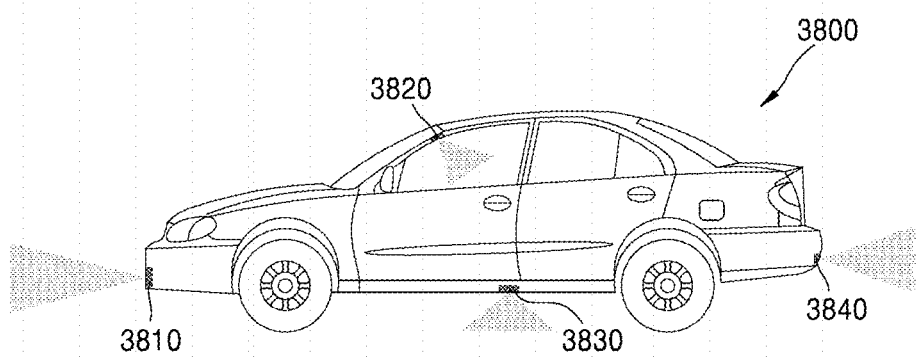

Also, the image sensor may be applied to a vehicle 3800 as shown in FIG. 34. The vehicle 3800 may include a plurality of vehicle cameras 3810, 3820, 3830, and 3840 arranged at various locations. Each of the vehicle cameras 3810, 3820, 3830, and 3840 may include an image sensor according to an example embodiment. The vehicle 3800 may provide a variety of information about an interior or surroundings of the vehicle 3800 to the driver by using the plurality of vehicle cameras 3810, 3820, 3830, and 3840, and provide information necessary for autonomous driving by automatically recognizing objects or people in the image.

The color separation element according to the example embodiment may implement multi-focusing on light having the same wavelength. Accordingly, even when pixels of the same color are continuously arranged, focusing may be effectively performed by using the color separation element. The image sensor according to the example embodiment may increase image quality by multi-focusing.

It should be understood that example embodiments described herein should be considered in a descriptive sense only and not for purposes of limitation. Descriptions of features or aspects within each example embodiment should typically be considered as available for other similar features or aspects in other example embodiments. While one or more example embodiments have been described with reference to the figures, it will be understood by those of ordinary skill in the art that various changes in form and details may be made therein without departing from the spirit and scope as defined by the following claims.

What is claimed is:

1. A color separation element in an image sensor comprising:
   a spacer layer;
   a color separation lens array comprising at least one nano-post provided on the spacer layer, the color separation lens array configured to control a phase distribution of incident light so that light having a same wavelength of the incident light is multi-focused on a plurality of target regions; and wherein the at least one nano-post is repeatedly arranged in a plurality of periodic regions; and
   a plurality of periodic regions in which the color separation lens array is repeatedly arranged,
   wherein each of the periodic regions comprises a plurality of pixels arranged two-dimensionally, and pixels of a same wavelength light, among the plurality of pixels, are arranged adjacent to each other in at least one of a horizontal direction and a vertical direction of the two-dimensional arrangement, and
   wherein the plurality of target regions correspond to the pixels of the same wavelength light arranged adjacent to each other in at least one of the horizontal direction and the vertical direction of the two-dimensional arrangement.

2. The color separation element of claim 1, wherein each of the plurality of periodic regions comprises a first group pixel region including a plurality of first pixels for focusing first wavelength light, respectively, a second group pixel region including a plurality of second pixels for focusing second wavelength light, respectively, a third group pixel region including a plurality of third pixels for focusing third wavelength light, respectively, and a fourth group pixel region including a plurality of fourth pixels for focusing first wavelength light, respectively,
   wherein the first group pixel region and the fourth group pixel region are located in a diagonal direction, and the second group pixel region and the third group pixel region are located in a diagonal direction.

3. The color separation element of claim 2, wherein the first wavelength light comprises green light, the second wavelength light comprises blue light, and the third wavelength light comprises red light.

4. The color separation element of claim 2, wherein the plurality of first pixels in the first group pixel region are adjacently disposed, the plurality of second pixels in the second group pixel region are adjacently disposed, the plurality of third pixels in the third group pixel region are adjacently disposed, and the plurality of fourth pixels in the fourth group pixel region are adjacently disposed.

5. The color separation element of claim 2, wherein the color separation element is configured so that the first wavelength light has a phase of $2N\pi$ (N is an integer greater than 0) at the center of each pixel in the first group pixel region, and the phase is gradually decreased toward a periphery of the periodic region.

6. The color separation element of claim 2, wherein the color separation element is configured so that the second wavelength light has a phase of $2M\pi$ (M is an integer greater than 0) at the center of each pixel in the second group pixel region and the phase is gradually decreased toward a periphery of the periodic region.

7. The color separation element of claim 2, wherein the color separation element is configured so that the third wavelength light has a phase of $2L\pi$ (L is an integer greater than 0) at the center of each pixel in the third group pixel region and the phase is gradually decreased toward a periphery of the periodic region.

8. The color separation element of claim 1, wherein each of plurality of periodic regions comprises a first 2×2 group pixel region where first wavelength light is focused, a second 2×2 group pixel region where second wavelength light is focused, a third 2×2 group pixel region where third wavelength light is focused, and a fourth 2×2 group pixel region where the first wavelength light is focused, respectively,
wherein the first 2×2 group pixel region and the fourth 2×2 group pixel region are located in a diagonal direction, and the second 2×2 group pixel region and the third 2×2 group pixel region are located in a diagonal direction.

9. The color separation element of claim 1, wherein each of the periodic regions comprises a first 3×3 group pixel region where first wavelength light is focused, a second 3×3 group pixel region where second wavelength light is focused, a third 3×3 pixel region where the third wavelength light is focused, and a fourth 3×3 group pixel region where the first wavelength light is focused, respectively,
wherein the first 3×3 group pixel region and the fourth 3×3 group pixel region are located in a diagonal direction, and the second 3×3 group pixel region and the third 3×3 group pixel region are located in a diagonal direction.

10. The color separation element of claim 1, wherein each of the periodic region comprises a first 3×3 group pixel region where first wavelength light is focused, a second 3×3 group pixel region where second wavelength light and third wavelength light are focused, a third 3×3 group pixel region where second wavelength light and third wavelength light are focused, and a fourth 3×3 group pixel region where first wavelength light is focused.

11. The color separation element of claim 1, wherein the color separation lens array is configured to diverge incident light by wavelength and to control the phase distribution so that light of the same wavelength is multi-focused.

12. An image sensor comprising:
an optical sensor including a plurality of photosensitive cells for sensing light;
a spacer layer provided on the optical sensor;
a color separation lens array comprising at least one nano-post provided on the spacer layer to control a phase distribution of incident light so that light having the same wavelength of the incident light is multi-focused on a plurality of target regions; and
a plurality of periodic regions in which the color separation lens array is repeatedly arranged,
wherein each of the periodic regions comprises a plurality of pixels arranged two-dimensionally, and pixels of a same wavelength light, among the plurality of pixels, are arranged adjacent to each other in at least one of a horizontal direction and a vertical direction of the two-dimensional arrangement, and
wherein the plurality of target regions correspond to the pixels of the same wavelength light arranged adjacent to each other in at least one of the horizontal direction and the vertical direction of the two-dimensional arrangement.

13. The image sensor of claim 12, wherein each of the plurality of periodic regions comprises a first group pixel region including a plurality of first photosensitive cells for focusing first wavelength light, respectively, a second group pixel region including a plurality of second photosensitive cells for focusing second wavelength light, respectively, a third group pixel region including a plurality of third photosensitive cells for focusing third wavelength light, respectively, and a fourth group pixel region including a plurality of fourth photosensitive cells for focusing first wavelength light, respectively,
wherein the first group pixel region and the fourth group pixel region are located in a diagonal direction, and the second group pixel region and the third group pixel region are located in a diagonal direction.

14. The image sensor of claim 13, wherein the first wavelength light comprises green light, the second wavelength light comprises blue light, and the third wavelength light comprises red light.

15. The image sensor of claim 13, wherein the image sensor is configured so that the first wavelength light has a phase of $2N\pi$ (N is an integer greater than 0) at the center of each pixel in the first group pixel region, and the phase is gradually decreased toward a periphery of the periodic region.

16. The image sensor of claim 13, wherein the image sensor is configured so that the second wavelength light has a phase of $2M\pi$ (M is an integer greater than 0) at the center of each pixel in the second group pixel region and the phase is gradually decreased toward a periphery of the periodic region.

17. The image sensor of claim 13, wherein the image sensor is configured so that the third wavelength light has a phase of $2L\pi$ (L is an integer greater than 0) at the center of each pixel in the third group pixel region and the phase is gradually decreased toward a periphery of the periodic region.

18. The image sensor of claim 12, wherein each of the plurality of periodic region comprises a first 2×2 group pixel region where first wavelength light is focused, a second 2×2 group pixel region where second wavelength light is focused, a third 2×2 group pixel region where third wavelength light is focused, and a fourth 2×2 group pixel region where the first wavelength light is focused, respectively,
wherein the first 2×2 group pixel region and the fourth 2×2 group pixel region are located in a diagonal direction, and the second 2×2 group pixel region and the third 2×2 group pixel region are located in a diagonal direction.

19. The image sensor of claim 12, wherein each of the plurality of periodic regions comprises a first 3×3 group pixel region where first wavelength light is focused, a second 3×3 group pixel region where second wavelength light is focused, a third 3×3 pixel region where the third wavelength light is focused, and a fourth 3×3 group pixel region where first wavelength light is focused, respectively,
wherein the first 3×3 group pixel region and the fourth 3×3 group pixel region are located in a diagonal direction, and the second 3×3 group pixel region and the third 3×3 group pixel region are located in a diagonal direction.

20. The image sensor of claim 12, wherein the color separation lens array is configured to control a phase distribution of incident light so that the incident light is diverged by wavelength and light of the same wavelength is multi-focused.

* * * * *